(12) United States Patent
Kalyanasundaram et al.

(10) Patent No.: US 11,856,720 B2
(45) Date of Patent: Dec. 26, 2023

(54) ACCESSORY DEVICES THAT COMMUNICATE WITH ELECTRONIC DEVICES

(71) Applicant: Apple Inc., Cupertino, CA (US)

(72) Inventors: Nagarajan Kalyanasundaram, Los Gatos, CA (US); Richard Hung Minh Dinh, Saratoga, CA (US); Amaury J. Heresztyn, Cupertino, CA (US); Frank F. Liang, San Jose, CA (US); Stephen T. Schooley, Menlo Park, CA (US); Lian Zhang, Cupertino, CA (US); Derek J. Dicarlo, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 329 days.

(21) Appl. No.: 17/157,938

(22) Filed: Jan. 25, 2021

(65) Prior Publication Data
US 2022/0117098 A1    Apr. 14, 2022

Related U.S. Application Data

(60) Provisional application No. 63/090,110, filed on Oct. 9, 2020.

(51) Int. Cl.
*H05K 5/02* (2006.01)
*G05B 15/02* (2006.01)
(Continued)

(52) U.S. Cl.
CPC .......... *H05K 5/0217* (2013.01); *G05B 15/02* (2013.01); *G08C 17/04* (2013.01); *H02J 50/10* (2016.02); *H05K 7/20* (2013.01)

(58) Field of Classification Search
CPC ........ H05K 5/0217; H05K 7/20; G05B 15/02; G08C 17/04; H02J 50/10; H02J 7/02;
(Continued)

(56) References Cited

U.S. PATENT DOCUMENTS 9,577,467 B1 * 2/2017 Karanikos ............. H02J 50/005
9,838,085 B2 * 12/2017 Bosscher ............. H01R 25/006
(Continued)

FOREIGN PATENT DOCUMENTS

KR    2014-0095327    8/2014
KR    2015-0096858    8/2015
(Continued)

OTHER PUBLICATIONS

Korean Office Action from Korean Patent Application No. 10-2021-0133974, dated Oct. 21, 2022, 11 pages including English language summary.

(Continued)

*Primary Examiner* — Ramesh B Patel
(74) *Attorney, Agent, or Firm* — BAKERHOSTETLER

(57) ABSTRACT

Electronic devices and accessory devices designed for communication with electronic devices are disclosed. An accessory device suitable for use with an electronic device can receive the electronic device. Subject to authentication, the electronic device can read information stored on the accessory device through respective wireless communication circuitry of the electronic device and the accessory device. For example, the accessory device can store information related to the material makeup of the accessory device, dimensional information of the accessory device, and other integrated features. This information can be read and received by the electronic device. As a result, the electronic device can adjust a control system (that regulates thermal energy generation) by increasing a set point temperature that allows one or more processors to operate in a manner consistent with additional thermal energy generation. However, the accessory device protects the user from exposure to the additional thermal energy, thereby preventing injury.

13 Claims, 14 Drawing Sheets

(51) Int. Cl.
*H02J 50/10* (2016.01)
*H05K 7/20* (2006.01)
*G08C 17/04* (2006.01)

(58) Field of Classification Search
CPC .... H04B 1/036; H04B 1/3888; H04B 5/0075; H04B 5/0031; H04B 5/0037
See application file for complete search history.

(56) References Cited

U.S. PATENT DOCUMENTS

| | | | |
|---|---|---|---|
| 9,954,375 B2* | 4/2018 | McCauley | H01F 38/14 |
| 10,027,380 B2* | 7/2018 | Hong | H04B 5/0037 |
| 10,248,143 B2 | 4/2019 | Greene et al. | |
| 10,324,507 B2* | 6/2019 | Mullins | G06F 1/26 |
| 11,342,777 B2* | 5/2022 | Partovi | H02J 50/40 |
| 11,342,792 B2* | 5/2022 | Partovi | G06F 1/1683 |
| 11,606,119 B2* | 3/2023 | Partovi | H02J 7/00302 |
| 2009/0212637 A1* | 8/2009 | Baarman | H01F 38/14 307/104 |
| 2009/0278642 A1* | 11/2009 | Fullerton | H01F 7/02 335/284 |
| 2012/0146576 A1* | 6/2012 | Partovi | H02J 7/0044 320/108 |
| 2012/0235504 A1* | 9/2012 | Kesler | H02J 50/70 307/104 |
| 2012/0313742 A1* | 12/2012 | Kurs | B60L 53/126 336/180 |
| 2015/0149042 A1* | 5/2015 | Cooper | B60R 25/245 701/48 |
| 2015/0255994 A1* | 9/2015 | Kesler | B60L 53/124 307/10.1 |
| 2016/0128210 A1* | 5/2016 | Lee | F16M 11/2021 248/206.5 |
| 2016/0189511 A1* | 6/2016 | Peterson | E05B 47/06 340/545.3 |
| 2017/0005399 A1* | 1/2017 | Ito | H01Q 1/38 |
| 2017/0070076 A1* | 3/2017 | Karanikos | H02J 7/0013 |
| 2017/0070077 A1* | 3/2017 | Karanikos | H02J 50/005 |
| 2017/0149474 A1* | 5/2017 | Kim | H04B 5/0075 |
| 2018/0331725 A1* | 11/2018 | Hong | H04B 5/0075 |
| 2019/0198212 A1* | 6/2019 | Levy | F16M 11/2021 |
| 2019/0235608 A1 | 8/2019 | Shin et al. | |
| 2020/0072421 A1* | 3/2020 | Dietzen | G08B 5/223 |
| 2020/0106484 A1* | 4/2020 | Holweg | H04W 4/80 |
| 2021/0099027 A1* | 4/2021 | Larsson | H04B 5/0037 |
| 2021/0210984 A1* | 7/2021 | Peralta | H02J 50/12 |
| 2022/0007804 A1 | 1/2022 | Kim et al. | |
| 2022/0094204 A1* | 3/2022 | Cloyd | A45C 15/00 |
| 2022/0117098 A1* | 4/2022 | Kalyanasundaram | H04B 1/036 |

FOREIGN PATENT DOCUMENTS

| | | |
|---|---|---|
| KR | 2016-0049671 | 5/2016 |
| KR | 2018-0038789 | 4/2018 |
| KR | 2018-0080475 | 7/2018 |
| KR | 2019-0108025 | 9/2019 |
| WO | 2015113086 A1 | 8/2015 |
| WO | 2018083901 A1 | 5/2018 |

OTHER PUBLICATIONS

Korean Office Action from Korean Patent Application No. 10-2021-0133974, dated Mar. 2, 2023, 9 pages including English language summary.

Korean Office Action from Korean Patent Application No. 10-2021-0133974, dated Jul. 3, 2023, 5 pages including English language summary.

* cited by examiner

ACCESSORY DEVICES THAT COMMUNICATE WITH ELECTRONIC DEVICES

CROSS-REFERENCE TO RELATED APPLICATIONS

The present application claims the benefit of U.S. Provisional Application No. 63/090,110, entitled "ACCESSORY DEVICES THAT COMMUNICATE WITH ELECTRONIC DEVICES," filed Oct. 9, 2020, the content of which is incorporated herein by reference in its entirety for all purposes.

FIELD

The described embodiments relate generally to accessory devices and electronic devices, and communication between the devices. More particularly, the present embodiments relate to accessory devices designed to transmit information, via wireless communication, to electronic devices. For example, the accessory device may transmit dimensional information or material makeup information to the electronic device when the electronic device is inserted into the accessory device. The electronic device can use the information to alter one or more operations.

BACKGROUND

Accessory devices can provide a protective case or cover for electronic devices. Generally, accessory devices include one or more materials that, when combined, provide a sufficiently thick accessory that protects against some events that would otherwise damage the electronic device. However, while accessory devices can provide the aforementioned benefits, there are some drawbacks to using accessory devices. For instance, some accessory devices inadvertently form a "heat trap" by virtue of their position on the electronic device. Moreover, advances in processor technology provide faster processing speeds for electronic devices, but generate more heat during operation. Several electronic devices are designed to "throttle down," or reduce the processing speed of the processor(s) in the electronic device when a threshold temperature is detected, thereby allowing the processor(s) to cool down. In some instances, electronic devices are designed to automatically shut down (without a user command) when a threshold temperature is detected. Accordingly, in some instances, the throttle down operation can be exacerbated by an accessory device that traps heat, leading to lower performance of the electronic device and an undesired user experience. Accordingly, some users are required to choose between protecting their electronic device (with the accessory device) or permitting greater processing capabilities (without the accessory device protecting their electronic device).

SUMMARY

In one aspect, a portable electronic device is described. The portable electronic device may include a housing defining an internal volume that stores components. The components may include a magnetic field sensor configured to detect a magnetic field from a magnetic assembly external to the housing. The components may further include processing circuitry configured to compare the magnetic field detected by the magnetic field sensor with a predetermined magnetic field. The components may further include a wireless communication circuit. In some embodiments, when the processing circuitry determines the magnetic field matches the predetermined magnetic field, within a predetermined tolerance, the wireless communication circuit reads information from an external wireless communication circuit. The components may further include an integrated circuit separate from the processing circuitry. The components may further include a control system configured to regulate the integrated circuit to operate in accordance with a first set point temperature. In some embodiments, when the information is received by the wireless communication circuit, the control system is configured to regulate the integrated circuit to operate in accordance with a second set point temperature that is greater than the first set point temperature.

In another aspect, an accessory device suitable for use with a portable electronic device is described. The accessory device may include a bottom wall. The accessory device may further include sidewalls extending from the bottom wall. In some embodiments, the bottom wall and the sidewalls combine to define a receptacle for the portable electronic device. The accessory device may further include a magnetic assembly disposed in the bottom wall. The magnetic assembly may generate a magnetic field that defines a magnetic field vector. The accessory device may further include a wireless communication circuit disposed in the bottom wall. The wireless communication circuit may be configured to transmit information to the portable electronic device subsequent to an authentication based upon the magnetic field vector.

In another aspect, a method for controlling an electronic device is described. The method may include receiving, by a magnetic field sensor, a magnetic field from a magnetic assembly external to the electronic device. The method may further include comparing, by processing circuitry, the magnetic field with a predetermined magnetic field. The method may further include, when the processing circuitry determines the magnetic field matches the predetermined magnetic field within a predetermined tolerance, receiving, by a wireless communication circuit, information from an external wireless communication circuit. The method may further include controlling, by a control system, an integrated circuit to operate in accordance with a first set point temperature. The method may further include, when the information is received by the wireless communication circuit, increasing, by the control system, from the first set point temperature to a second set point temperature greater than the first set point temperature such that the control system controls the integrated circuit to operate in accordance with the set point temperature.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

Figure 1:
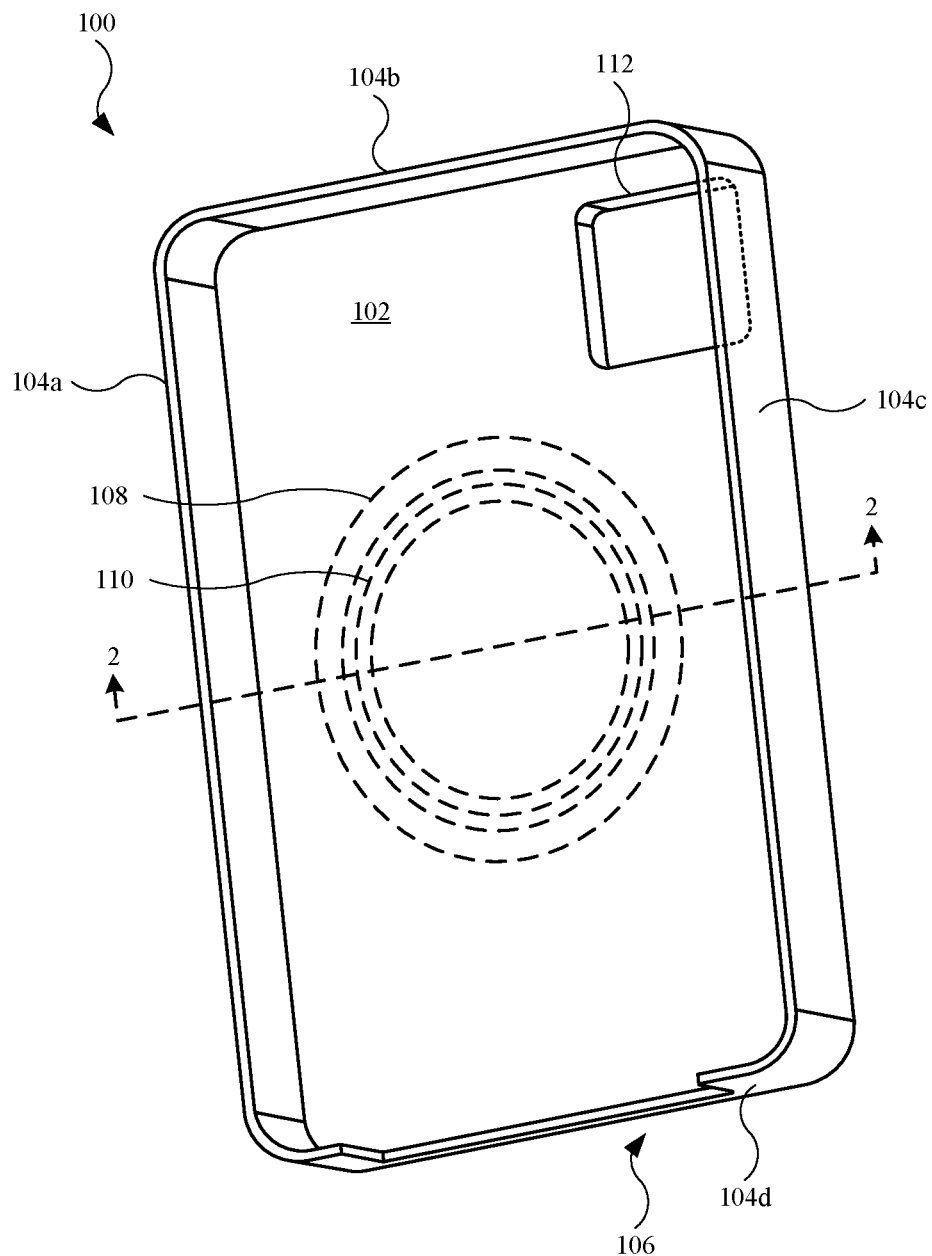
FIG. 1 illustrates an isometric view of an embodiment of an accessory device.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

This application is directed to accessory devices designed to enhance the overall user experience of electronic devices, including portable electronic devices such as mobile wireless communication devices (e.g., smartphones, tablet computing devices) and laptop computing devices, as non-limiting examples. Accessory devices described herein may include cases, covers, folios/wallets, and sleeves, as non-limiting examples. Further, accessory devices described herein can communicate information, such as characteristics and features of an accessory device, to electronic devices. For example, an accessory device may include a near-field communication ("NFC") circuit that can transmit, through wireless communication using NFC protocol, information related to the type of accessory device, material makeup of the accessory device, dimensional information of the accessory device, and other integrated features of the accessory device. The electronic device can use this information to alter one or more operations, thus optimizing performance.

Some electronic devices have a built-in control system designed to control component temperatures, particularly heat-generating operational components. For example, an electronic device may include processors, or processing circuitry, such as a central processing unit ("CPU"), a graphics processing unit ("GPU"), and/or an application-specific integrated circuit ("ASIC"), that generate thermal energy, or heat, during operation. Generally, the thermal energy generated by a processor is a function of the complexity of operations (e.g., lines of code) being processed, the frequency or processing speed, and the time duration of use of the processor, as non-limiting examples.

In order to control thermal energy generation, electronic devices described herein may include a control system that relies on temperature sensors and software. For example, a control system using a set point temperature, or threshold temperature, can monitor one or more processors with one or more temperature sensors, and when a temperature sensor indicates the temperature at or near the processor reaches or exceeds the set point temperature, the control system can restrict use/operation of the processor, or in some cases shut down the processor (or the electronic device itself) as a mechanism to limit or prevent further thermal energy generation. Additionally, the electronic devices may include thermally conductive hardware (e.g., heat spreaders, metals) to dissipate thermal energy through conduction and/or convection. The control system (and other aforementioned design modifications) not only decreases the likelihood of damage to the processors and/or surrounding components, but also reduces thermal exposure to a user. Regarding the latter, the control system can prevent injury to the user.

When the electronic device is within a sufficient proximity to the electronic device, the transfer of information from the accessory device to the electronic device may occur through respective NFC circuits. For instance, accessory devices described herein may include a receptacle designed to receive an electronic device, thus defining, at minimum, "sufficient proximity" between the electronic device and the accessory device. Additionally, prior to an information transfer event, an authentication protocol, or "handshake," may occur between the electronic device and the accessory device. In this regard, the accessory device may include a magnetic assembly that generates a unique magnetic field represented by a magnetic field vector. The magnetic assembly of the accessory device can act as a "key" used by the electronic device, which relies upon a magnetometer to read/detect the magnetic field vector from the magnetic assembly, to authenticate the accessory device. Accordingly, other accessory devices with a magnet or magnetic assembly that do not generate the unique magnetic field vector may be deemed "non-compatible" by the electronic device, and thus, no information transfer event occurs between the electronic device and the accessory device.

By receiving the information from the accessory device, the electronic device can subsequently alter certain processes to improve performance. For example, when the electronic device receives dimensional information and material makeup of the accessory device, the electronic device can determine it is covered/surrounded by the accessory device, and can adjust/increase the set point temperature of the control system, thereby allowing the processor(s) to run more complex operations for a longer period of time. While the set point temperature increase corresponds to increased thermal energy production, the accessory device is positioned over the electronic device (including a metal housing), and can shield the user from excessive thermal energy exposure. Further, in some instances, accessory devices described herein are designed to receive and dissipate the thermal energy generated by an electronic device. This may include a heat spreader, as a non-limiting example.

These and other embodiments are discussed below with reference to FIGS. 1-19. However, those skilled in the art will readily appreciate that the detailed description given herein with respect to these figures is for explanatory purposes only and should not be construed as limiting.

FIG. 1 illustrates an isometric view of an embodiment of an accessory device 100. In some embodiments, accessory device 100 is a folio, a wallet, or a sleeve. In the embodiment shown in FIG. 1, accessory device 100 is a case. As shown, accessory device 100 may include a wall 102, also referred to as a back wall or bottom wall. Accessory device 100 may further include several sidewalls, including a sidewall 104a, a sidewall 104b, a sidewall 104c and a sidewall 104d, each of which extend from wall 102. Wall 102 and sidewalls 104a, 104b, 104c, and 104d combine to define a receptacle 106, or cavity or space, for an electronic device (not shown in FIG. 1). The material makeup of wall 102 and sidewalls 104a, 104b, 104c, and 104d may vary, based on the embodiment. For example, in some embodiments, wall 102 and sidewalls 104a, 104b, 104c, and 104d are defined in part by materials, such as leather, faux leather, polycarbonate, and microfiber. In some embodiments, wall 102 and sidewalls 104a, 104b, 104c, and 104d are defined in part by silicone, polycarbonate, and microfiber. In some embodiments, wall 102 and sidewalls 104a, 104b, 104c, and 104d are defined in part by one or more transparent polymers.

Additionally, wall 102 may include several features. For example, wall 102 may include a magnetic assembly 108. Magnetic assembly 108 is designed to magnetically couple with an external device, such as a wireless charger having an inductive transmitting coil. Magnetic assembly 108 may include a variety of configurations. For example, magnetic assembly 108 may include several magnetic elements, or alternatively, magnetic assembly 108 may include a single magnetic element. Also, as shown, magnetic assembly 108 may include a circular magnetic assembly. However, other shapes and configurations are possible. The number of magnetic elements, as well as the size, shape, location and polarity of the magnetic elements of magnetic assembly 108 may define a unique magnetic field vector. This will be further discussed below.

Wall 102 may further include a wireless communication circuit 110. In some embodiments, wireless communication circuit 110 is configured for transmission in accordance with BLUETOOTH® protocol, which may additional require a battery (not shown in FIG. 1). In the embodiment shown in FIG. 1, wireless communication circuit 110 is configured for transmission in accordance with near-field communication ("NFC") protocol, and can provide relatively low-power transmission of information. Also, as shown, wireless communication circuit 110 may include a circular wireless communication circuit concentric with respect to magnetic assembly 108. However, other shapes and configurations are possible. Wireless communication circuit 110 is designed to transmit information related to accessory device 100 to an electronic device positioned in receptacle 106. For instance, wireless communication circuit 110 can transmit information related to the material makeup of wall 102 and sidewalls 104a, 104b, 104c, and 104d, as well as that of magnetic assembly 108. Alternatively, or in combination, wireless communication circuit 110 can transmit information related to the dimension, or thickness, of wall 102 and sidewalls 104a, 104b, 104c, and 104d. An electronic device that reads and receives information from wireless communication circuit 110 can alter one or more operations for optimization purposes. This will be discussed below. Also, wall 102 may include an opening 112 designed to receive/accommodate a camera assembly of an electronic device.

Figure 2:
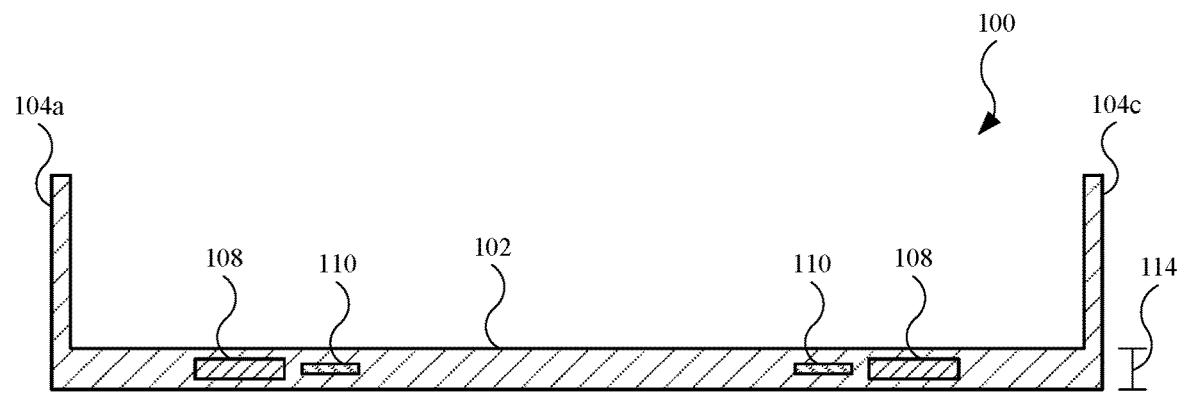
FIG. 2 illustrates a cross sectional view of the accessory device shown in FIG. 1, taken along line 2-2, showing additional features of the accessory device.

FIG. 2 illustrates a cross sectional view of accessory device 100 shown in FIG. 1, taken along line 2-2, showing additional features of accessory device 100. As shown, wall 102 includes a thickness 114 corresponding to a 1-dimensional length of wall 102. The dimension of thickness 114 of wall 102 can be stored as information on, and subsequently transmitted by, wireless communication circuit 110. Additionally, the size, shape, and location of magnetic assembly 108 and wireless communication circuit 110 can also be stored as information on, and subsequently transmitted by, wireless communication circuit 110. This may also include the layout of magnetic assembly 108, including the number of magnetic elements of magnetic assembly 108. Further, the size and shape of sidewalls (sidewalls 104a and 104c shown) of accessory device 100 can also be stored as information on, and subsequently transmitted by, wireless communication circuit 110. Wireless communication circuit 110 is capable of transmitting all the aforementioned stored information to an electronic device (not shown in FIG. 2).

Prior to transmission from accessory device 100 to an electronic device, an authentication procedure may occur to ensure compatibility between accessory device 100 and an electronic device. The authentication procedure can ensure the electronic device is an approved electronic device for accessory device 100, or vice versa.

Figure 3:
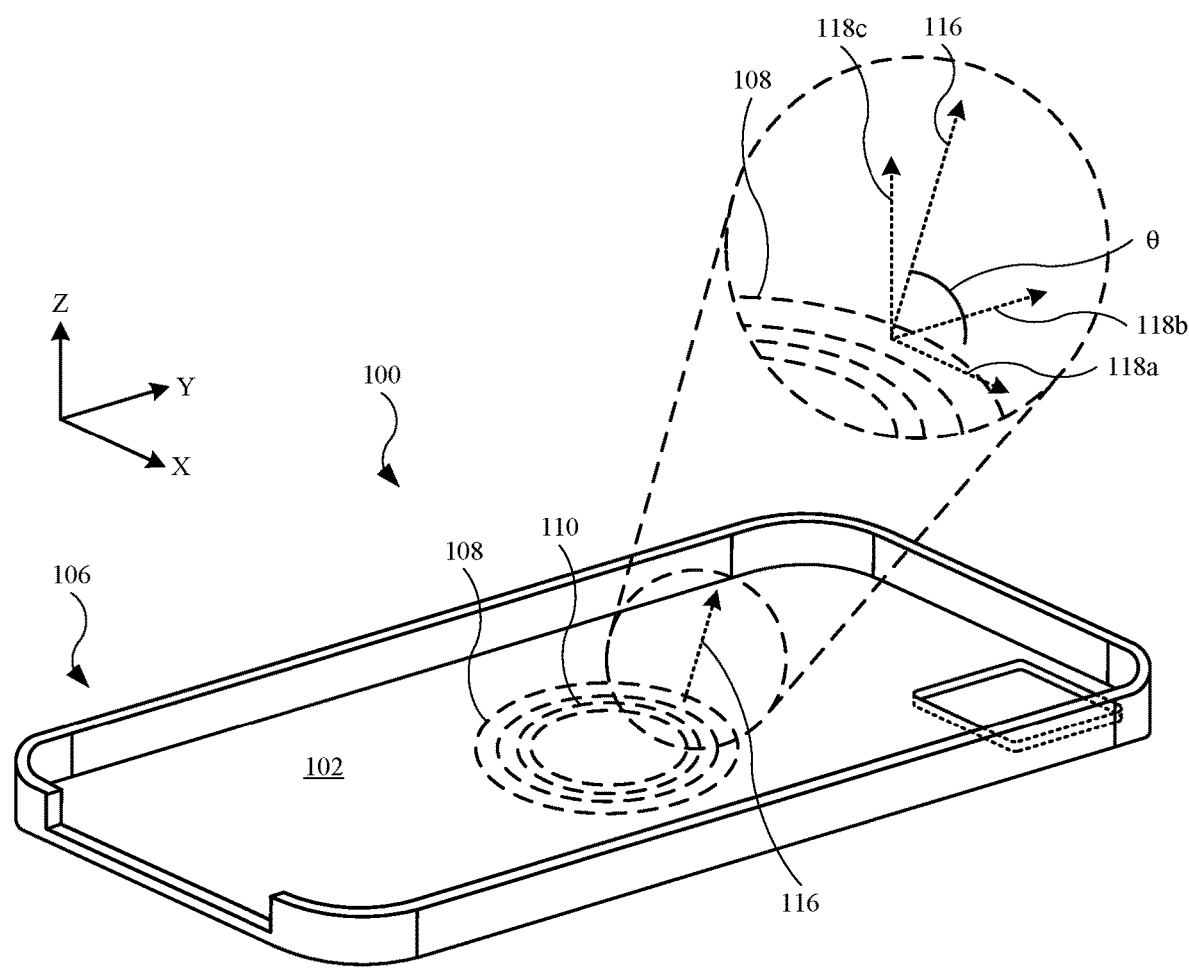
FIG. 3 illustrates an alternate isometric view of the accessory device, showing features of the magnetic assembly.

FIG. 3 illustrates an alternate isometric view of accessory device 100, showing features of magnetic assembly 108. Magnetic assembly 108, as a collection of one or more magnetic elements, generates a magnetic field. The resultant magnetic field can be represented by a magnetic field vector 116, indicating at least a direction and magnitude of the magnetic field generated by magnetic assembly 108. As shown in the enlarged view, magnetic field vector 116 is a function of an X-axis magnetic field 118a, a Y-axis magnetic field 118b, and a Z-axis magnetic field 118c. An electronic device (not shown in FIG. 3), positioned in receptacle 106 of accessory device 100, can use a magnetic field sensor to detect a magnetic field generated by magnetic assembly 108, and further, detect magnetic field vector 116, including the direction and/or magnitude of magnetic field vector 116. The electronic device can further compare magnetic field vector 116 with a predetermined (or predefined or preprogrammed) magnetic field vector, and if the electronic device determines a sufficient match, within a predetermined tolerance (e.g., 60% to 100%), between magnetic field vector 116 and the predetermined magnetic field vector, the electronic device can authenticate, or initiate a "handshake" with, accessory device 100, and can subsequently read information from wireless communication circuit 110. Alternatively, if the electronic device determines there is not a sufficient match between magnetic field vector 116 and the predetermined magnetic field vector, no handshake occurs and the electronic device is not permitted to read information from wireless communication circuit 110.

Magnetic field vector 116 can form an angle θ (shown in the enlarged view) relative to an X-Y plane defined by, for example, wall 102 of accessory device 100. When angle θ is a non-zero angle (in degrees), magnetic field vector 116 may include a component in three different dimensions. Angle θ can vary in different embodiments of accessory device 100. For example, based on magnetic assembly 108, magnetic field vector 116 can form angle θ greater than 0 degrees and up to 90 degrees (relative to wall 102) in any direction with a Z-component outside of the X-Y plane. Electronic devices described herein can use a magnetic field sensor to detect the characteristics of magnetic field vector 116, including magnitude and angle θ.

It should be noted that magnetic field vector 116 shown in FIG. 3 is an exemplary magnetic field vector, and a magnetic assembly different from magnetic assembly 108 may generate a magnetic field with a magnetic field vector different from magnetic field vector 116. Also, in some embodiments, different accessory devices may include different magnetic assemblies, with each accessory device model (e.g., case, cover, wallet, sleeve, etc.) having a unique magnetic assembly, thus generating a unique magnetic field vector. Electronic devices described herein may use the unique magnetic field vector to determine which model or type of accessory device is currently being used with the electronic device. In other words, in some embodiments, magnetic field vector 116 defines a unique magnetic field vector associated specifically with accessory device 100, or associated with a model number corresponding to accessory device 100.

Figure 4:
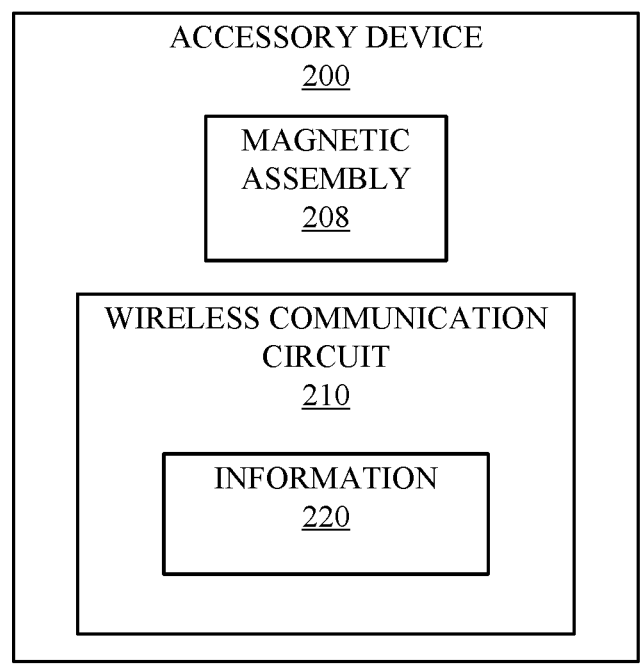
FIG. 4 illustrates a schematic diagram of an accessory device, in accordance with some described embodiments.

FIG. 4 illustrates a schematic diagram of an accessory device 200, in accordance with some described embodiments. Accessory device 200 may include a magnetic assembly 208 designed to magnetically couple with an external device, such as a wireless charger. Also, when the electronic device is positioned/disposed in accessory device 200 (e.g., a receptacle of accessory device 200), magnetic assembly 208 may be aligned with an inductive charging receiver coil in an electronic device. In this manner, when the wireless charger is used to charge (through inductive charging) a battery of the electronic device, magnetic assembly 208 can align the wireless charger with the inductive charging receiver coil in the electronic device, thereby increasing charging efficiency, which can contribute to less energy required to charge the battery.

Additionally, accessory device 200 includes a wireless communication circuit 210, which may include an NFC circuit, as a non-limited example. Wireless communication circuit 210 is designed to transmit information 220 related to accessory device 200. Information 220 can be stored on memory provided by wireless communication circuit 210, or alternately, on a separate memory circuit. Information 220 may include the model or serial number of accessory device 200, material makeup of accessory device 200, dimensional information of accessory device 200, and/or information related to magnetic assembly 208. In this regard, when an electronic device is within sufficient proximity to wireless communication circuit 210, the electronic device can read/receive information 220 using its own wireless communication circuit.

Figure 5:
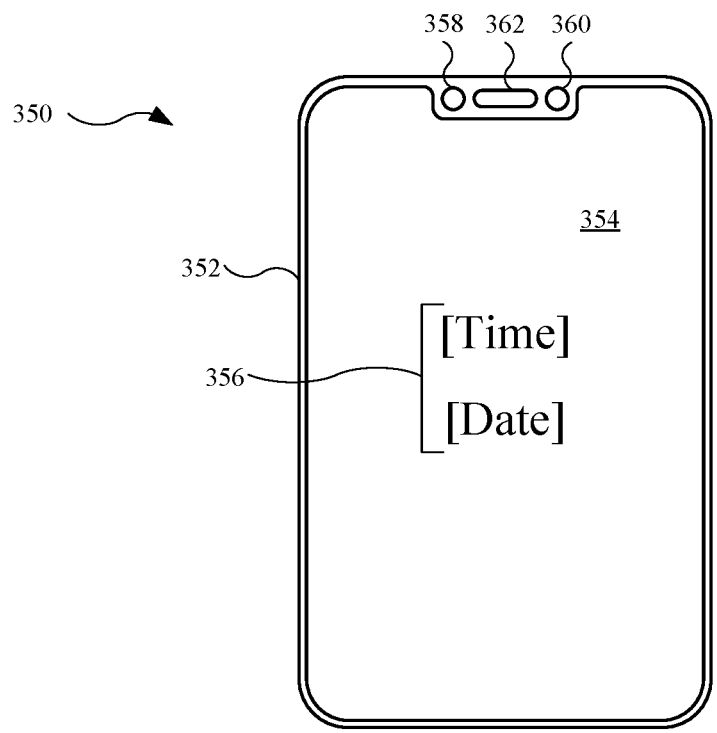
FIG. 5 illustrates a plan view of an embodiment of an electronic device, in accordance with some described embodiments.

FIG. 5 illustrates a plan view of an electronic device 350, in accordance with some described embodiments. Electronic device 350 is suitable for use with accessory devices described herein, such as accessory device 100 (shown in FIG. 1). Electronic device 350 may include a smartphone or a tablet computing device, as non-limiting examples. As shown, electronic device 350 includes a housing 352, or enclosure, which may include a metal housing. Electronic device 350 further includes a display 354 coupled with housing 352. Display 354, which may include a display commonly known in the art for mobile device displays, is designed to present visual information 356. As shown, visual information 356 includes date and time information. However, visual information 356 may include a variety of other textual information, as well as still images and/or motion (video) images.

Additionally, electronic device 350 may include a camera 358 designed to capture images that are external to electronic device 350. Electronic device 350 may further include a light sensor 360 designed to detect and determine light intensity, and provide light intensity information to processing circuitry (not shown in FIG. 5) of electronic device 350. The light intensity information provided by light sensor 360 can be used to, for example, determine whether display 354 is covered and subsequently whether to deactivate display 354. In some embodiments, camera 358 can also be used to determine whether display 354 is covered and subsequently whether to deactivate display 354. Also, electronic device 350 may include an audio speaker 362 designed to emit acoustical energy in the form of audible sound. Camera 358, light sensor 360, and audio speaker 362 are exemplary input and output mechanisms of electronic device, and the number (and order/position) of these mechanisms may vary in other embodiments.

Figure 6:
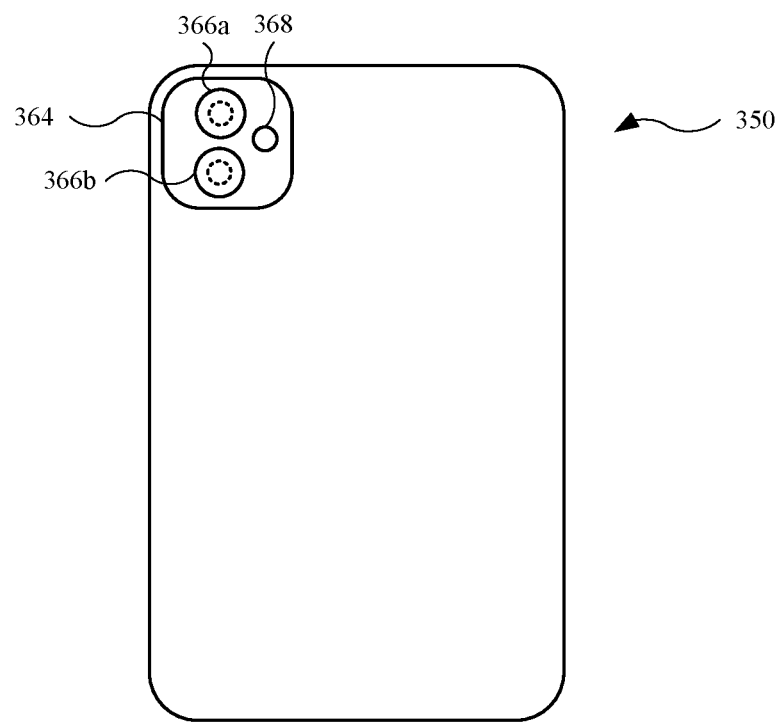
FIG. 6 illustrates an alternate plan view of the electronic device shown in FIG. 5, showing additional features of the electronic device.

FIG. 6 illustrates an alternate plan view of electronic device 350 shown in FIG. 5, showing additional features of electronic device 350. The back/rear side of electronic device 350 is shown. At this location, electronic device 350 may include a protruding feature 364 in which several features are located. For instance, at protruding feature 364, electronic device 350 may include a camera 366a and camera 366b. Although cameras 366a and 366b are shown, the number of cameras may vary. Additionally, electronic device 350 may include a light source 368, which may include a flash light source, that provides additional light during an image capturing event by camera 366*a* or camera 366*b*.

Figure 7:
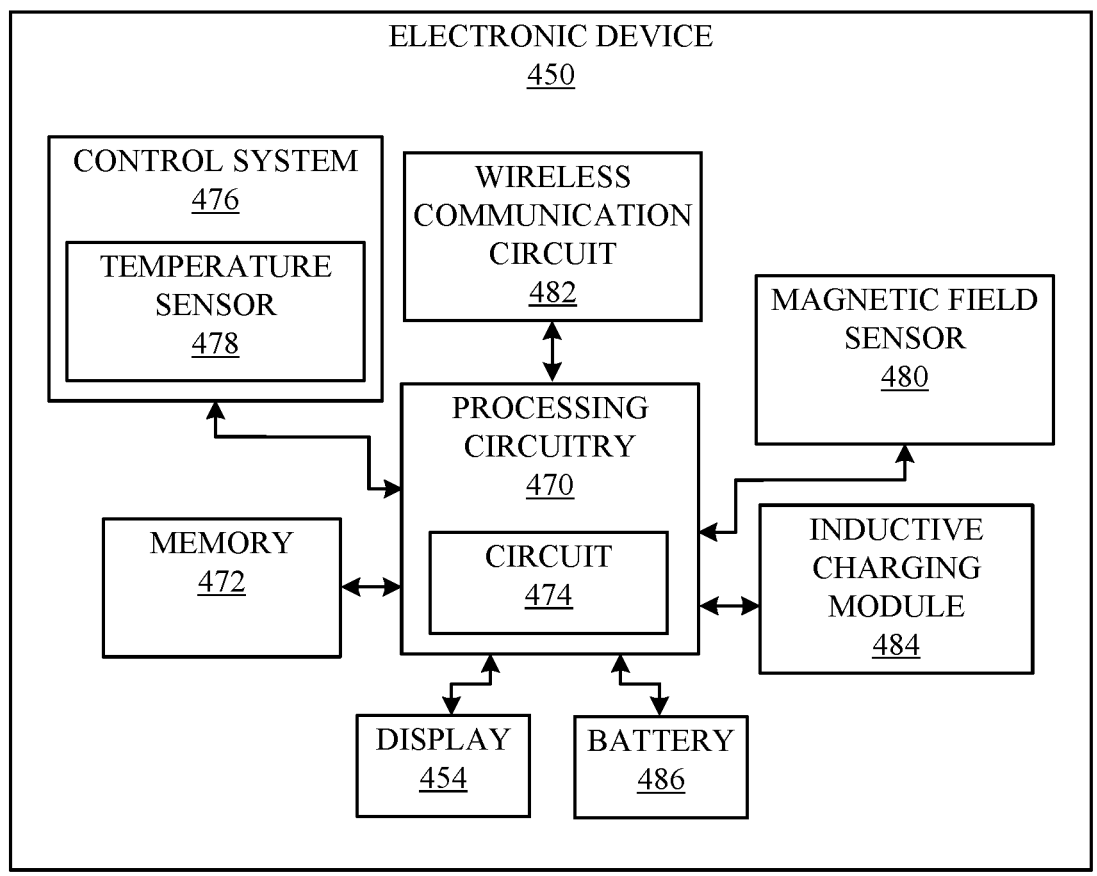
FIG. 7 illustrates a schematic diagram of an electronic device, in accordance with some described embodiments.

FIG. 7 illustrates a schematic diagram of an electronic device 450, in accordance with some described embodiments. Electronic device 450 is suitable for use with accessory devices described herein. Further, electronic devices (including electronic device 350, shown in FIG. 5) described herein may include features shown and described for electronic device 450. As shown, electronic device 450 includes processing circuitry 470. Processing circuitry 470 may include a CPU, as a non-limiting example, designed to execute one or more programs stored on memory 472. In this regard, processing circuitry 470 may include controlling circuitry for a circuit 474, which may include a GPU or an ASIC, as non-limiting examples. Circuit 474 is also designed to execute one or more programs stored on memory 472.

During operation, processing circuitry 470 and/or circuit 474 may generate thermal energy. In some instances, excessive thermal energy can cause damage to processing circuitry 470 and/or circuit 474, or further, cause injury to a user. In this regard, electronic device 450 may include a control system 476 (composed of hardware circuitry and software) designed to limit/reduce thermal energy generated by processing circuitry 470 and circuit 474. For example, control system 476 may include a temperature sensor 478 (representing one or more temperature sensors) located on or near processing circuitry 470, and/or on or near circuit 474. Temperature sensor 478 (or sensors) can monitor the temperature (or at least an approximate temperature) of processing circuitry 470 and/or circuit 474, and provide an input (representing the monitored temperature) to control system 476. Using input information from temperature sensor 478, control system 476 can determine whether the temperature of processing circuitry 470 and/or circuit 474 reaches a set point temperature, or threshold temperature. When the set point temperature is reached, control system 476 can provide a signal or command to processing circuitry 470, thereby causing processing circuitry 470 and/or circuit 474 to limit or cease operations, which may include reducing the processing frequency, or reducing the number of software applications running, as non-limiting examples. Temperature sensor 478 can continue to monitor processing circuitry 470 and/or circuit 474, and when the temperature is below the set point temperature, control system 476 can cease limiting or preventing processing circuitry 470 and/or circuit 474 from their respective operations, thereby allowing processing circuitry 470 and/or circuit 474 to resume operations.

In some embodiments, control system 476 may include advanced features. For example, in addition to allowing processing circuitry 470 and/or circuit 474 to operate in accordance with a first, or initial, set point temperature (described above), control system 476 can also allow processing circuitry 470 and/or circuit 474 to operate in accordance with a second, or subsequent, set point temperature. The second set point temperature may be higher than the first set point temperature. In some embodiments, the first set point temperature is selected in a range of 55 to 65 degrees Celsius, and the second set point temperature is selected in a range of 75 to 85 degrees Celsius. By allowing processing circuitry 470 and/or circuit 474 to operate in accordance with the second set point temperature, processing circuitry 470 and/or circuit 474 can operate at higher temperatures, which corresponds to additional processes or more complex processes, before control system 476 provides a control signal to limit or cease processing circuitry 470 and/or circuit 474 from further operations. For example, advanced gaming systems, with detailed, high-resolution graphics and high-frequency display refresh rates, are known to cause processing circuitry 470 and/or circuit 474 to generate a relatively high amount of thermal energy. When electronic device 450 uses processing circuitry 470 (e.g., CPU) and circuit 474 (e.g., GPU) to run an advanced gaming system on a display 454, processing circuitry 470 and circuit 474 may each generate a relatively high amount of thermal energy that causes the internal temperature to exceed the first set point temperature. However, when control system 476 allows processing circuitry 470 and circuit 474 to exceed the first set point temperature, control system 476 does not restrict processing circuitry 470 and circuit 474 until the temperature (as determined by temperature sensor 478) reaches the second set point temperature. Accordingly, the user of electronic device 450 can play the advanced gaming system for a longer period of time, and in some cases, without interruption. Accordingly, control system 476 allows processing circuitry 470 and/or circuit 474 to perform a first set of operations when regulated by the first set point temperature. Additionally, control system 476 allows processing circuitry 470 and/or circuit 474 to perform a second (different) set of operations when regulated by the first set point temperature. Generally, the second set of operations is associated with permitting greater processing frequency, higher complexity software applications (e.g., advanced gaming), and additional software applications running simultaneously, as opposed to the first set of operations.

In order to enable control system 476 to monitor processing circuitry 470 and circuit 474 at the second set point temperature, electronic device 450 can receive an indication that electronic device 450 is disposed/position within, or carried by, an accessory device (e.g., any accessory device described herein). In this regard, electronic device 450 may further include a magnetic field sensor 480 designed to detect a magnetic field generated from a magnet or magnetic assembly external to electronic device 450. In some embodiments, magnetic field sensor 480 is a Hall Effect sensor. In the embodiment shown in FIG. 7, magnetic field sensor 480 is a magnetometer. In this regard, magnetic field sensor 480 can detect a magnet field from not only a magnetic assembly, but also can detect the Earth's magnetic field, and accordingly, electronic device 450 can use magnetic field sensor 480 to provide a compass, i.e., a software application that provides compass information presented on display 454.

Additionally, magnetic field sensor 480 can detect a magnetic field from a magnetic assembly in an accessory device, such as magnetic assembly 108 of accessory device 100 (shown in FIG. 1). Moreover, magnetic field sensor 480 can determine/detect a magnetic field vector, such as magnetic field vector 116 of magnetic assembly 108 (shown in FIG. 3), and provide the determined/detected magnetic field vector (including direction and magnitude) to processing circuitry 470. In this regard, magnetic field sensor 480 is designed to detect the characteristics of a magnetic field vector of an accessory device described herein, including the magnitude and angle of the magnetic field vector, the latter of which may include an angle formed by a magnetic field vector with three components in three different dimensions. Magnetic field sensor 480 can detect a magnetic field vector in a variety of magnitudes and angles. Processing circuitry 470 can compare the detected magnetic field vector with a predetermined magnetic field vector, either through a lookup table stored on memory 472 or a remote server, including a cloud-based server. When a sufficient match, within a predetermined tolerance (e.g., 60% to 100%), between the detected magnetic field vector and the predetermined magnetic field vector is determined, the electronic device 450 can authenticate an accessory device through a "handshake," for example.

Further, the magnetic field vector detected by magnetic field sensor 480 based upon the location of magnetic field sensor 480 in electronic device 450. Accordingly, the position of magnetic field sensor 480 can be accounted for in determining the magnetic field vector, as the magnetic field vector, as detected by magnetic field sensor 480. Accordingly, a magnetic field vector (from a magnetic assembly) can register differently (i.e., as a different magnetic field vector in terms of magnitude and angle) at different positions/locations relative to magnet field sensor 480.

Electronic device 450 may further include a wireless communication circuit 482. Wireless communication circuit 482 may include an NFC circuit, as a non-limiting example. Subsequent to the aforementioned authentication process, electronic device 450 can use wireless communication circuit 482 to read information from a wireless communication circuit of an accessory device, such as information 220 from wireless communication circuit 210 of accessory device 200 (shown in FIG. 4). Wireless communication circuit 482 can provide the information to processing circuitry 470. The information provided to processing circuitry 470 may include the type of the accessory device (e.g., case, cover/folio, wallet, sleeve, etc.), the material makeup of the accessory device, and/or dimensional information of the accessory device, as non-limiting examples.

In some embodiments, the exchange of information between wireless communication circuit 482 and a wireless communication circuit of an accessory device can be minimized. For example, in some embodiments, using memory 472, electronic device 450 stores a prior instance of a detected magnet field vector and resultant information read from a wireless communication circuit of an accessory device (that generated the magnetic field vector). Further, using magnetic field sensor 480, electronic device 450 can detect a current instance of a detected magnet field vector. The two magnetic field vectors can be compared by using, for example, processing circuitry 470. If the difference between the two vectors is below (or within) a threshold difference value, then electronic device 450 can determine the same accessory device currently used with electronic device 450 was previously used with electronic device 450. The "threshold difference value" can be a function of several characteristics, such as an average and standard deviation or hysteresis, to create an acceptable vector range that the currently detected magnetic field vector may fall within. As a result, the exchange of wireless communication may not be required, and electronic device 450 can retrieve, using memory 472, the characteristics of an accessory device that was previously used with electronic device 450. Accordingly, in this exemplary embodiment, a "predetermined magnetic field vector" corresponds to a magnetic field vector stored on the electronic device through a prior instance of the electronic device being used with the accessory device. Also, in some embodiments, memory 472 can store several, if not all, instances of a detected magnetic field and electronic device 450 can compare a currently-detected magnetic field vector, using magnetic field sensor 480, with any prior stored instance of a magnet field vector to determine/predict the accessory device currently being used with electronic device 450 and forego reading from the wireless communication circuit of the accessory device, as electronic device 450 already has the information previously read from the accessory device stored on memory 472.

Moreover, in some instances, an external magnet (different from a magnetic assembly) can combine with the magnetic assembly to generate a different magnetic field vector. This can result in magnetic field sensor 480 detecting/determining a magnetic field vector different from an expected magnet field vector from a magnetic assembly of an accessory device. For example, wireless inductive chargers, magnets, and/or metals surfaces can alter the magnetic field vector provided by an accessory device to be detected by magnetic field sensor 480. In this regard, electronic device 450 can use an absolute magnetic field vector (in terms of magnitude and angle) or compare with a prior detected magnetic field vector that generated/initiated wireless communication with an accessory device. In either method, electronic device 450 can compare the detected (current) magnetic field vector with a range/threshold of predetermined or prior magnetic field vectors. When the current detected magnetic field vector is within an expected range of magnetic field vectors, electronic device 450 can initiate wireless communication to read the wireless communication circuit of the accessory device, or alternatively, electronic device 450 can determine the accessory device has previously provided information from the wireless communication circuit of the accessory device and use that information to make a determination about altering an operation of electronic device 450, such as adjusting a set point temperature.

In some embodiments, electronic device 450 determines, based on the information received from the accessory device, that the accessory device can sufficiently absorb thermal energy generated by the aforementioned heat-generating operational components of electronic device 450, and control system 476 can adjust the set point temperature to the second set point temperature. Alternatively, or in combination, electronic device 450 determines, based on the information received from the accessory device, that the accessory device can either sufficiently shield a user of electronic device 450 from the thermal energy generated by the aforementioned heat-generating operational components of electronic device 450, and control system 476 can adjust the set point temperature to the second set point temperature. Accordingly, accessory devices described herein can contribute to electronic device 450 adjusting to the second set point temperature, and running additional and/or more complex processes.

In some embodiments, control system 476 uses the received information to control processing circuitry 470 and/or circuit 474 in accordance with an intermediate, or third, set point temperature. The intermediate set point temperature may include a temperature between the first set point temperature and the second set point temperature. In this regard, electronic device 450 can control processing circuitry 470 and/or circuit 474 in accordance with a sliding scale of set point temperatures, which is based upon the selected accessory device and its material makeup and/or dimensional information. Accordingly, electronic device 450 can provide a dynamic set point temperature within a range of set point temperatures, as compared to a binary set point temperature configuration.

Regarding the material makeup, the information provided to processing circuitry 470 may include the presence of a magnetic assembly (such as magnetic assembly 108, shown in FIG. 1), including the number of magnetic elements, size and shape of each of the magnetic elements, and the magnetic polarity of each of the magnetic elements. Processing circuitry 470 can then determine that the accessory device can optimize a wireless charging event. For example, electronic device 450 may further include an inductive charging module 484 for wireless charging of a battery 486 of electronic device 450. Inductive charging module 484 may include an inductive charging receiver coil. The magnetic assembly in the accessory device may align with inductive charging module 484 when electronic device 450 is positioned in a receptacle of the accessory device. In this manner, a wireless charger used to provide a wireless charge to battery 486 is aligned with inductive charging module 484, thereby increasing efficiency (i.e., less energy required per charge, or less time with the same amount of energy) of the wireless charging event.

Also, in some embodiments, electronic device 450, having received the information that includes the material makeup of the accessory device, can further optimize inductive charging module 484 to increase charging efficiency. For example, electronic device 450 can determine (or at least approximate) the effective impedance of a wireless charger when the accessory device is positioned between the wireless charger and electronic device 450. In other words, when a wireless charger is used to charge battery 486 via inductive charging module 484, the accessory device can alter the overall impedance of the wireless charging event. In this regard, electronic device 450 can use the information related to the accessory device to adjust the impedance of the inductive charging module 484 to match (or at least substantially match) that of the effective impedance, based on the wireless charger and the accessory device, thereby increasing charging efficiency during a wireless charging event.

Figure 8:
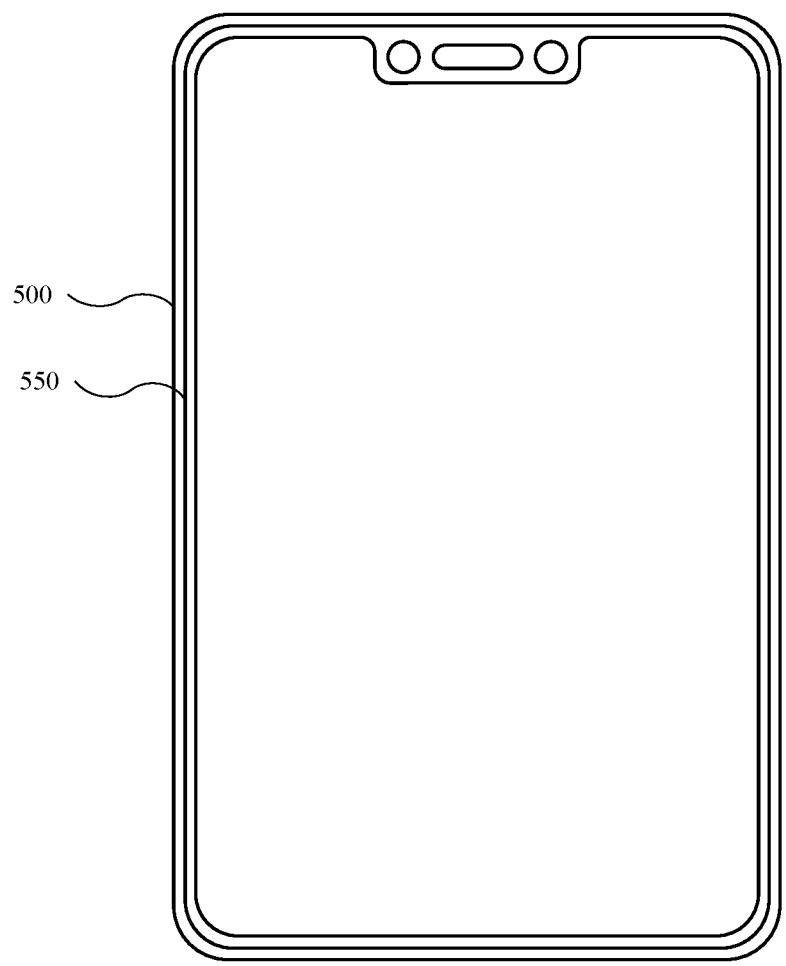
FIG. 8 illustrates a plan view of an electronic device positioned in an accessory device, in accordance with some described embodiments.

FIG. 8 illustrates a plan view of an electronic device 550 positioned in an accessory device 500, in accordance with some described embodiments. Accessory device 500 and electronic device 550 may include any features described herein for an accessory device and an electronic device, respectively. In this regard, accessory device 500 and electronic device 550 may each include a wireless communication circuit. Also, when electronic device 550 is positioned within a receptacle (not labeled) of accessory device 500, as shown in FIG. 8, electronic device 550 and accessory device 500 are within sufficient proximity for their respective wireless communication circuits to communicate with each together. For example, the wireless communication circuit of electronic device 550 can read information from the wireless communication circuit of accessory device 500. Alternatively, "sufficient proximity" may be defined as a distance between electronic device 550 and accessory device 500 in which a magnetic field sensor (e.g., magnetic field sensor 480 in FIG. 7) can detect a magnetic field vector (e.g., magnetic field vector 116 in FIG. 3). In this regard, in some embodiments, a magnetic field sensor of electronic device 550 can detect a magnetic field vector of accessory device 500 even when electronic device 550 is not positioned in a receptacle of accessory device 500.

Figure 9:
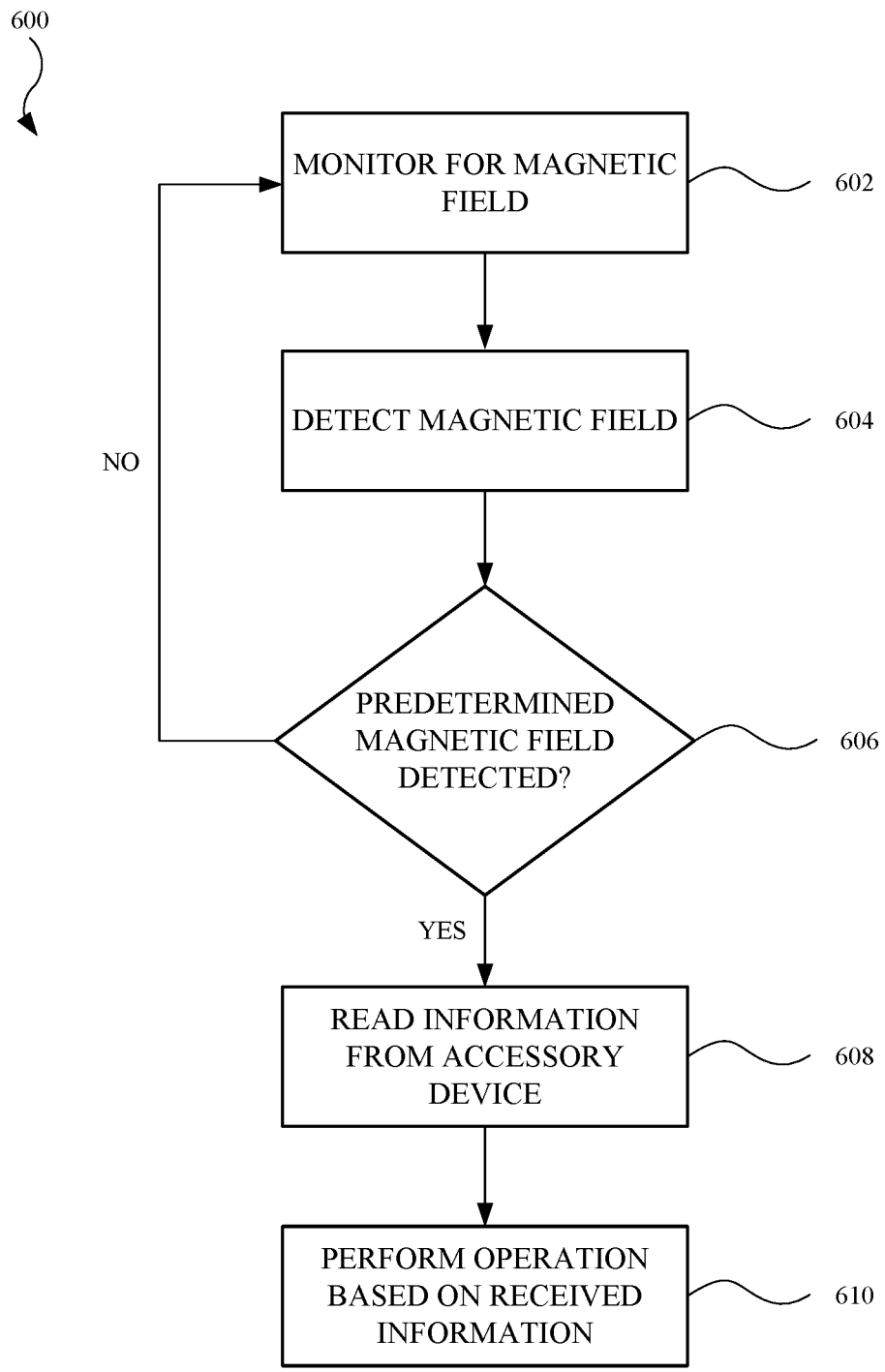
FIG. 9 illustrates a flowchart showing an exemplary process for altering an electronic device based on interaction with an accessory device, in accordance with some described embodiments.

FIG. 9 illustrates a flowchart 600 showing an exemplary process for altering an electronic device based on interaction with an accessory device, in accordance with some described embodiments. In step 602, the electronic device can monitor for a magnetic field. The electronic device may include a magnetic field sensor, such as a magnetometer (as a non-limiting example). The magnetic field to be monitored may include a magnetic field generated by a magnetic assembly located in an accessory device.

In step 604, a magnetic field is detected. This may include the magnetic field from the aforementioned magnetic assembly. The magnetic field sensor can detect the direction and magnitude of the magnetic field, represented as a magnetic field vector. Additionally, the magnetic field sensor can detect an angle of the magnetic field vector that lies outside a two-dimensional (e.g., X-Y) plane.

In step 606, a determination is made whether the detected magnetic matches a predetermined magnetic field. The electronic device can compare the detected magnetic field vector with a predetermined (or predefined or preprogrammed) magnetic field vector. If the electronic device determines a sufficient match, within a predetermined tolerance (e.g., 60% to 100%), between the detected magnetic field vector and the predetermined magnetic field vector, the electronic device can authenticate, or initiate a "handshake" with, the accessory device. In some embodiments, the magnetic field vector corresponds to a particular model of accessory device. In this regard, the electronic device can determine the model of the accessory device, including several features thereof. If, on the other hand, the detected magnetic field vector does not sufficiently match the predetermined magnet field vector, flowchart 600 returns to step 602.

In another example, an electronic device can store a prior instance of a detected magnet field vector and the information read from a wireless communication circuit of an accessory device. The two magnetic field vectors (current and prior) can be compared, and if the difference between the two vectors is below a threshold difference value, the electronic device can determine the same accessory device used with electronic device in the prior instance is currently being used. Also, the electronic device can store several, if not all, instances of a detected magnetic field and can compare a currently-detected magnetic field vector with any prior stored instance of a magnet field vector to determine/predict the accessory device currently being used with electronic device and forego reading from the wireless communication circuit of the accessory device, as electronic device already has the information previously read from the accessory device stored on memory. Accordingly, the "predetermined magnet field" in this example corresponds to a magnetic field vector stored on the electronic device through a prior instance of the electronic device being used with the accessory device.

When flowchart 600 proceeds to step 608, the electronic device reads the information from the accessory device. The electronic device may include a wireless communication circuit capable of reading the information from a corresponding wireless communication circuit of the accessory device. The information may include the material makeup of the accessory device, the dimensional information of the accessory device, and the size, shape and location of the magnetic assembly of the accessory device, as non-limiting examples. It should be noted that, in some instances, step 608 may only occur subsequent to the detection of a magnetic field vector matching the predetermined magnetic field vector, as described in step 606.

In step 610, the electronic device may perform an operation based on the received information. In some embodiments, the operation performed includes raising/increasing a set point temperature from a first set point temperature to a second set point temperature, or adjusting the set point temperature to an intermediate set point temperature between the first and second set point temperatures. In some embodiments, the operation performed includes adjusting the impedance of an inductive charging module of the electronic device to match that of an effective impedance of a wireless charger when the accessory device (positioned between the electronic device and the wireless charging mechanism) is accounted for. In some embodiments, the operation performed includes an application-specific mode based on receiving application-specific information. For example, the application-specific information may include aviation information, automotive/driving information, or home automation information. In this regard, the application-specific information may cause the electronic device to enable some features (e.g., display certain software applications) and disable other applications (e.g., touch input to the display). This will be discussed further below.

Figure 10:
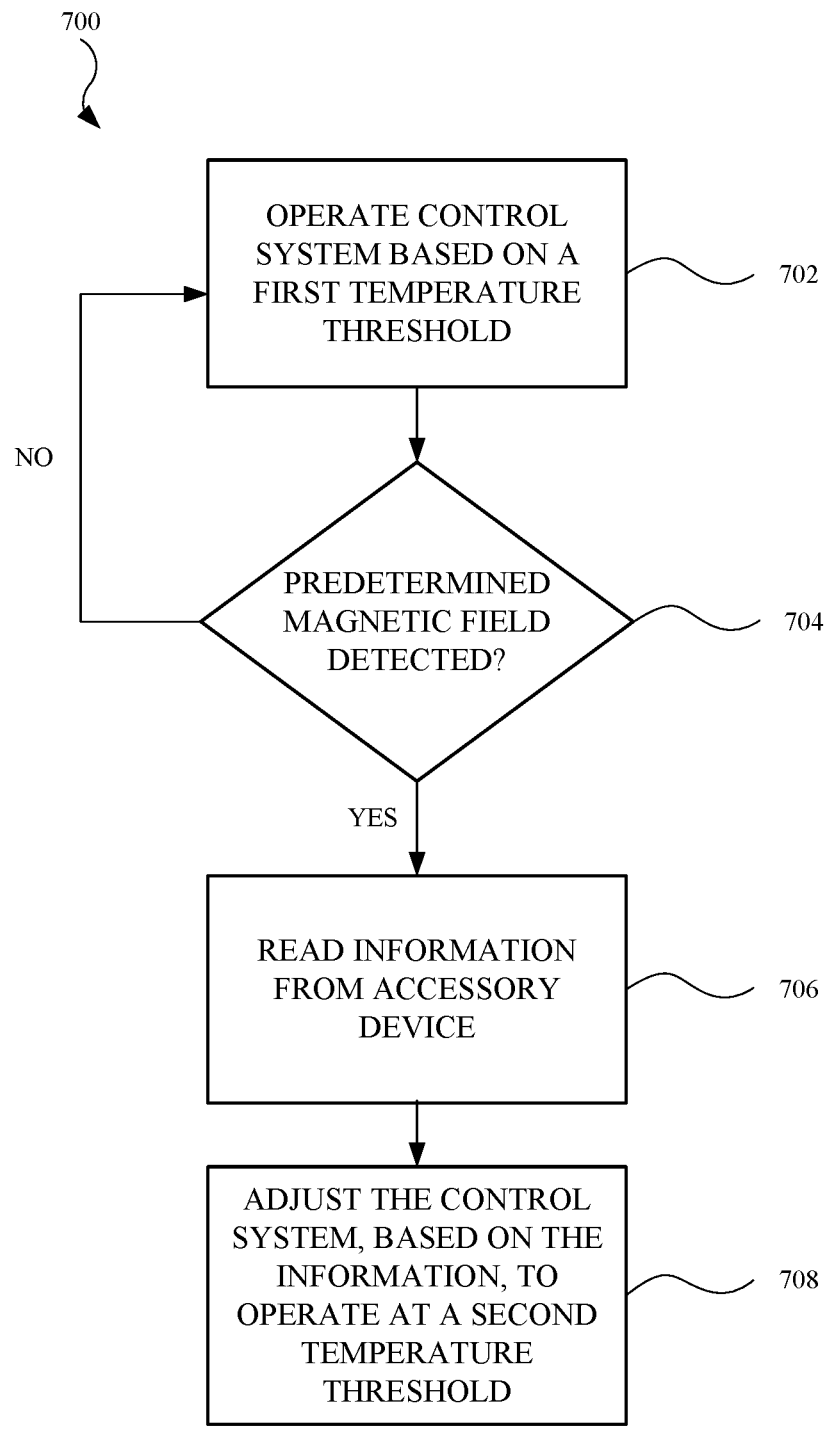
FIG. 10 illustrates a flowchart showing an exemplary process for controlling an electronic device, in accordance with some described embodiments.

FIG. 10 illustrates a flowchart 700 showing an exemplary process for controlling an electronic device, in accordance with some described embodiments. In step 702, a control system of the electronic device is operated based on a first temperature threshold, or first set point temperature. The control system of the electronic device is designed to monitor operational components, specifically heat-generating operational components. In this manner, the electronic device may include one or more temperature sensors (e.g., solid-state temperature sensors, thermistors) that are positioned in the electronic device in a location(s) near the heat-generating operational components. The control system can use one or more temperature sensors to monitor the temperature of the heat-generating operational components, and when it is determined that a heat-generating operational component(s) reaches a temperature at (or in some cases, above) the first temperature threshold, the control system can provide a signal to the heat-generating operational component(s) to limit or prevent additional usage of the heat-generating operational component(s), thereby limiting further thermal energy generation.

The control system can control a heat-generating operational component to operate based on a first temperature threshold in different ways. For example, the control system can limit the frequency of operations of a heat-generating operational component that includes a processor circuit. In other words, in accordance with the first temperature threshold, the control system can limit the processing speeds to a frequency below the maximum specified frequency of the processor circuit. As another example, the control system can shut down a heat-generating operational component when the temperature reaches or exceeds the first temperature threshold. In yet another example, the control system can limit the number of software applications running on a heat-generating operational component that includes a processor circuit.

In step 704, a determination is made whether a predetermined magnetic field is detected. In this regard, the electronic device may include a magnetic field sensor, such as a magnetometer (as a non-limiting example). The magnetic field to be monitored may include a magnetic field generated by a magnetic assembly located in an accessory device. A magnetic field vector may represent the direction and magnitude of the magnetic field. The electronic device can compare the detected magnetic field vector with a predetermined (or predefined or preprogrammed) magnetic field vector. If the electronic device determines a sufficient match, within a predetermined tolerance (e.g., 60% to 100%), between the detected magnetic field vector and the predetermined magnetic field vector, the electronic device can authenticate, or initiate a "handshake" with, the accessory device, and can subsequently read information from a wireless communication circuit of the accessory device. If, on the other hand, the detected magnetic field vector does not sufficiently match the predetermined magnet field vector, flowchart 700 returns to step 702.

In another example, an electronic device can store a prior instance of a detected magnet field vector and the information read from a wireless communication circuit of an accessory device. The two magnetic field vectors (current and prior) can be compared, and if the difference between the two vectors is below a threshold difference value, the electronic device can determine the same accessory device used with electronic device in the prior instance is currently being used. Also, the electronic device can store several, if not all, instances of a detected magnetic field and can compare a currently-detected magnetic field vector with any prior stored instance of a magnet field vector to determine/predict the accessory device currently being used with electronic device and forego reading from the wireless communication circuit of the accessory device, as electronic device already has the information previously read from the accessory device stored on memory. Accordingly, the "predetermined magnet field" in this example corresponds to a magnetic field vector stored on the electronic device through a prior instance of the electronic device being used with the accessory device.

In step 706, the electronic device reads the information from the accessory device. The electronic device may include a wireless communication circuit capable of reading the information from a corresponding wireless communication circuit of the accessory device. It should be noted that, in some instances, step 706 may only occur subsequent to the detection of a magnetic field vector matching the predetermined magnetic field vector, as described in step 704.

The information provided to the electronic device may include several features related to the accessory device. For example, the information may include the material makeup of the accessory device. The material makeup of the accessory device may include some combination of leather, faux leather, microfiber, or silicone, as non-limiting examples. The material makeup of the accessory device may also include a magnetic assembly, including the size, shape, and location of the magnetic elements of the magnetic assembly, as well as the magnetic polarity of each of the magnetic elements. Additionally, the information may include dimensional information of the accessory device, such as the thickness of a back wall or bottom wall of the accessory device.

In step 708, the control system is adjusted to operate based on a second temperature threshold, or second set point temperature, based on the information received from the accessory device. The second temperature threshold may be greater than the first temperature threshold. The electronic device can use the information related to, for example, the material makeup of the accessory device, and determine that a heat-generating operational component(s) of the electronic device can operate at a higher temperature (e.g., above the first temperature threshold), and thus generate additional thermal energy at the higher temperature. At least some of the generated thermal energy can be absorbed, dissipated, and/or redirected through one or more materials of the accessory device. In this manner, a user holding the accessory device with the electronic device disposed in the accessory device (see FIG. 8, for example) will not be injured through thermal energy exposure. Moreover, the dimensional information of the accessory device, when received by the electronic device, can be used to approximate an amount of thermal energy the accessory device can absorb, thereby contributing to a determination whether the user will be sufficiently shielded from thermal energy.

The control system can control a heat-generating operational component to operate based on a second temperature threshold in different ways. For example, the control system can allow the processing speed, or processing frequency, of a processor circuit to exceed, as compared to the (limited) frequency associated with the first temperature threshold. As another example, the control system may not initiate a shutdown event of a heat-generating operational component that exceeds a temperature above the first temperature threshold. In yet another example, the control system can increase the number of software applications running on a heat-generating operational component that includes a processor circuit. However, it should be noted that when one or more temperatures sensors determine the heat-generating operational components reach (or in some cases, exceed) the second temperature threshold, the control system can subsequently limit or prevent further operations of the heat-generating operational components.

FIGS. 11-17 show and describe alternate embodiments of accessory devices. Although not shown and described for each embodiments, the accessory devices shown and described in FIGS. 11-17 may include several features described herein for accessory devices.

Figure 11:
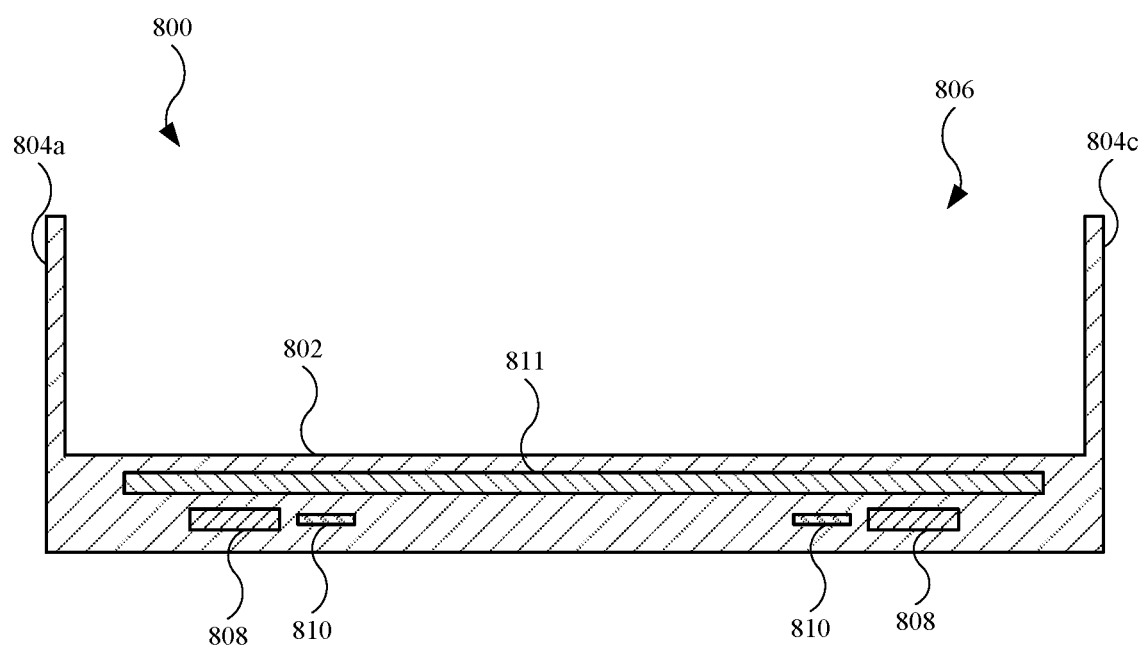
FIG. 11 illustrates a cross sectional view of an alternate embodiment of an accessory device, showing additional materials of the accessory device.

FIG. 11 illustrates a cross sectional view of an alternate embodiment of an accessory device 800, showing additional materials of accessory device 800. Similar to prior embodiments, accessory device 800 may include a wall 802, and sidewalls (sidewalls 804a and 804c shown) that extend from wall 802 to form a receptacle 806 for an electronic device (not shown in FIG. 11). Additionally, accessory device 800 may include a magnetic assembly 808 and a wireless communication circuit 810, which may include any features described herein for a magnetic assembly and a wireless communication circuit, respectively.

Accessory device 800 may further include a heat spreader 811. As shown, heat spreader 811 is located in wall 802. However, in some embodiments (not shown), heat spreader 811 extends into at least one of sidewalls 804a and 804c. In some embodiments, heat spreader 811 includes a thermally conductive material, such as a metal (e.g., copper). In some embodiments, heat spreader 811 includes a thermally conductive non-metal material, such as graphite. In some embodiments, heat spreader 811 includes a phase change material (e.g., wax) capable of absorbing thermal energy from an electronic device by changing from a solid to a liquid. The type of heat spreader 811 integrated into accessory device 800 can be stored as information on wireless communication circuit 810 and subsequently transmitted to an electronic device in a manner previously described.

Figure 12:
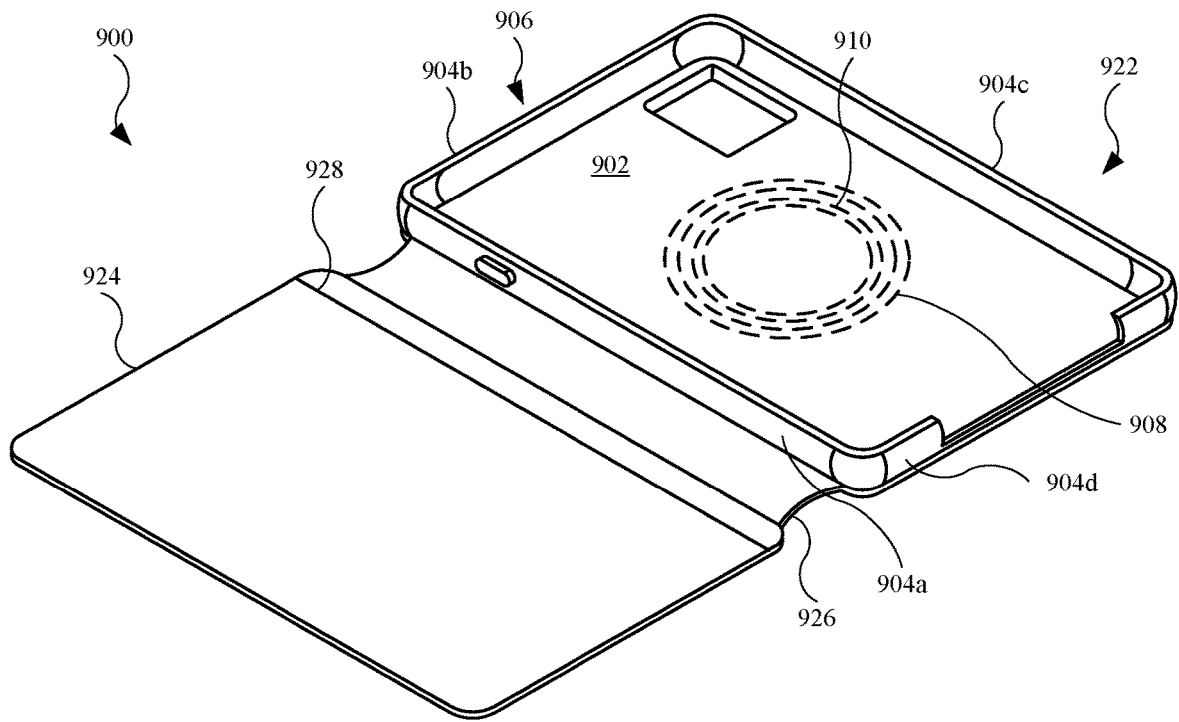
FIG. 12 illustrates an isometric view of an alternate embodiment of an accessory device, showing the accessory device having a case and a cover.

FIG. 12 illustrates an isometric view of an alternate embodiment of an accessory device 900, showing accessory device 900 having a case 922 and a cover 924. As shown, accessory device 900 may include a wall 902, also referred to as a back wall or bottom wall. Accessory device 900 may further include several sidewalls, including a sidewall 904a, a sidewall 904b, a sidewall 904c and a sidewall 904d, each of which extend from wall 902. Wall 902 and sidewalls 904a, 904b, 904c, and 904d combine to define a receptacle 906, or cavity or space, for an electronic device (not shown in FIG. 12). Also, similar to prior embodiments, accessory device 900 may include a magnetic assembly 908 and a wireless communication circuit 910 that may include any features described herein for a magnetic assembly and a wireless communication circuit, respectively.

Cover 924 is designed to pivot/rotate relative to case 922, based on a hinge 926 that is coupled with case 922 and cover 924. Accordingly, hinge 926 allows relative movement between case 922 and cover 924. Cover 924 may include a sleeve 928 that can store various personal items, such as credit cards or cash (as non-limiting examples). While accessory device 900 is in an open position in FIG. 12, cover 924 can rotate relative to, and be positioned on, case 922 in order conceal and protect an electronic device positioned in receptacle 906, thereby placing the accessory device 900 in a closed position.

Figure 13:
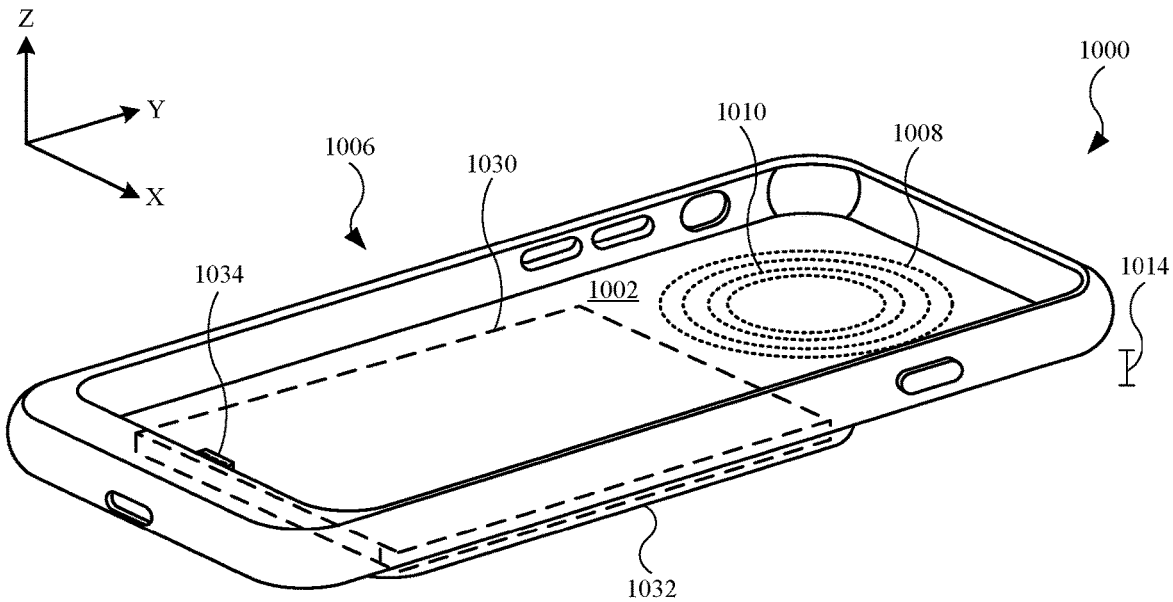
FIG. 13 illustrates an isometric view of an alternate embodiment of an accessory device, showing the accessory device with a battery.

FIG. 13 illustrates an isometric view of an alternate embodiment of an accessory device 1000, showing accessory device 1000 with a battery 1030. Similar to prior embodiments, accessory device 1000 may include a receptacle 1006, defined by a wall 1002 and several sidewalls (not labeled). Further, accessory device includes battery 1030 stored in a compartment 1032. Accessory device 1000 includes a connector 1034 designed to electrically couple with an electronic device (not shown in FIG. 13) disposed in receptacle 1006. In this manner, battery 1030 can be used to charge a battery of the electronic device, based in part on the electrical connected formed by connector 1034. In some embodiments (not shown), accessory device 1000 includes one or more electrical contacts located on wall 1002, with the electrical contacts designed to electrically couple to corresponding electrical contacts of an electronic device when the electronic device is positioned in receptacle 1006. Also, similar to prior embodiments, accessory device 1000 may include a magnetic assembly 1008 and a wireless communication circuit 1010 that may include any features described herein for a magnetic assembly and a wireless communication circuit, respectively.

Wireless communication circuit 1010 may store information related not only to the material makeup of accessory device 1000, but also a thickness 1014, or length along the Z-axis. Thickness 1014 may include a combined thickness of wall 1002 and compartment 1032. Moreover, wireless communication circuit 1010 may also store information related to battery 1030. In this manner, wireless communication circuit 1010 can transmit this information to an electronic device, and the electronic can determine thermal characteristic of accessory device 1000, which can be used to, for example, determine whether to alter a set point temperature by a control system of the electronic device.

Figure 14:
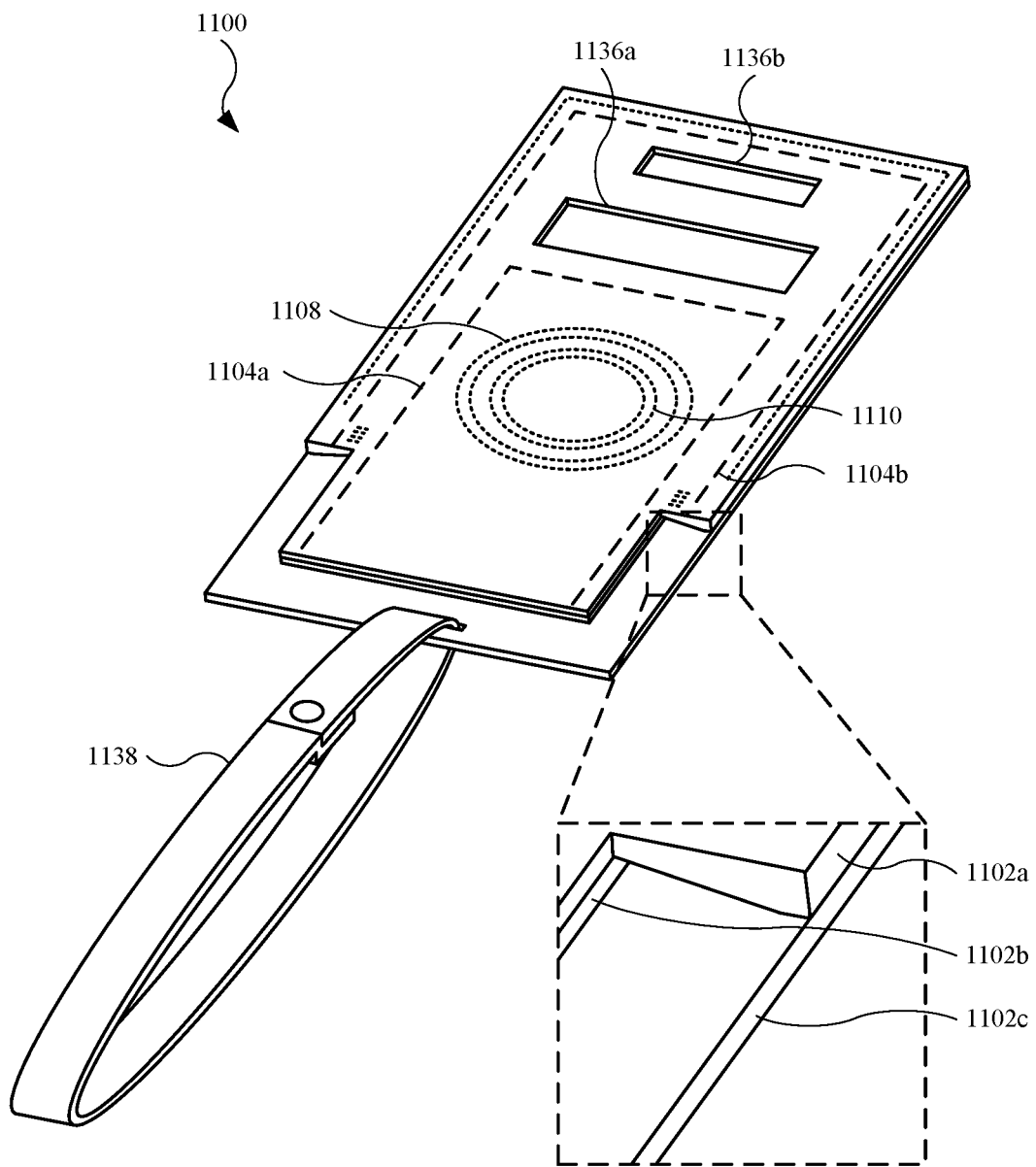
FIG. 14 illustrates an isometric view of an alternate embodiment of an accessory device, showing the accessory device having multiple sleeves or pockets for various items.

FIG. 14 illustrates an isometric view of an alternate embodiment of an accessory device 1100, showing accessory device 1100 having multiple sleeves or pockets for various items. Accessory device 1100 is designed to carry and support an electronic device, as well as carry/hold a user's personal items, such as credit cards, hotel cards, cash, etc., as non-limiting examples. In this regard, accessory device 1100 may include multiple sections coupled together. For example, as shown in the enlarged view, accessory device 1100 includes a section 1102a, a section 1102b, and a section 1102c. Sections 1102a, 1102b, and 1102c may be referred to as a first section, a second section, and a third section, respectively. Additionally, sections 1102a and 1102c may be referred to as a front (or top) section and back (or rear or bottom) section, respectively, while section 1102b may be referred to as a middle section. Sections 1102a, 1102b, and 1102c define pockets (or sleeves or cavities) for a user's personal items. For example, sections 1102a and 1102b define a pocket 1104a for a user's credit cards, cash, etc., while sections 1102b and 1102c define a pocket 1104b for an electronic device. Pockets 1104a and 1104b are shown as dotted lines. Also, similar to prior embodiments, accessory device 1100 may include a magnetic assembly 1108 and a wireless communication circuit 1110 (embedded in section 1102c) that may include any features described herein for a magnetic assembly and a wireless communication circuit, respectively.

Although an electronic device (not shown in FIG. 14) may be substantially covered by accessory device 1100 when the electronic device is inserted into pocket 1104b, accessory device 1100 is nonetheless designed to promote user interaction with the portable electronic device. For example, section 1102a may include an opening 1136a and an opening 1136b. In some embodiments, opening 1136a renders a region of a display of the electronic device at least partially visible, and as a result, the display can present visual information viewable through opening 1136a. In some embodiments, opening 1136b renders input and output mechanisms (e.g., camera(s), sensor(s), and/or audio speaker(s)) of the electronic device unobscured/unobstructed, and as a result, the electronic device can use the input and output mechanisms, based on opening 1136b, while being positioned in accessory device 1100. Wireless communication circuit 1110 may store information related not only to the material makeup of accessory device 1100, but also the size, shape, and location of openings 1136a and 1136b. In this manner, wireless communication circuit 1110 can transmit this information to an electronic device, and the electronic device can determine thermal characteristic of accessory device 1100, which can be used to, for example, determine whether to alter a set point temperature by a control system of the electronic device.

Also, a strap 1138 may extend from accessory device 1100. Strap 1138 is sized and shaped to fit around a user's appendage (e.g., wrist or forearm) thus providing another means for carrying accessory device 1100 by the user. In some embodiments, strap 1138 is permanently coupled with accessory device 1100. In the embodiment shown in FIG. 14, strap 1138 can be removed from accessory device 1100.

Figure 15:
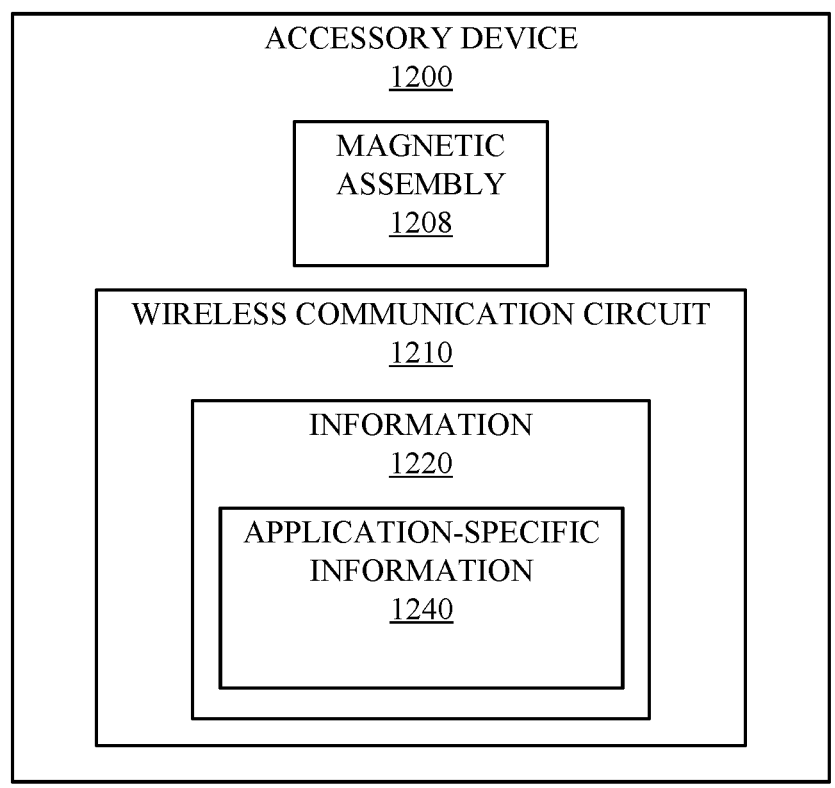
FIG. 15 illustrates a schematic diagram of an accessory device designed for application-specific purposes.

FIG. 15 illustrates a schematic diagram of an accessory device 1200 designed for application-specific purposes. Accessory device 1200 may include a structural embodiment described herein for an accessory device. As a non-limiting example, accessory device 1200 may take the form of accessory device 100 (shown in FIG. 1). As shown, accessory device 1200 may include a magnetic assembly 1208 and a wireless communication circuit 1210 that may include any features described herein for a magnetic assembly and a wireless communication circuit, respectively.

Wireless communication circuit 1210 may further include information 1220 that can be read from, or transmitted by, wireless communication circuit 1210. Information 1220 may include any information described herein for information on a wireless communication circuit. Additionally, information 1220 may further include application-specific information 1240. Application-specific information 1240 may include characteristics and features such that, when transmitted to an electronic device, causes the electronic device to initiate a particular software application(s). In some embodiments, the particular software application(s) is otherwise inaccessible or unavailable to a user unless or until the electronic device receives application-specific information 1240. Moreover, in some embodiments, application-specific information 1240 can initiate/enable or terminate/disable some hardware devices of the electronic device in order for the aforementioned initiated software to operate in a particular manner.

The following examples show and describe a variety of ways of utilizing application-specific information 1240, and should not be construed as limiting. In some embodiments, accessory device 1200 is an aviation-based accessory device and application-specific information 1240, when received by an electronic device, causes the electronic device to initiate a software application(s) related to aviation/flying. As a result, processing circuitry of the electronic device may signal a display of the electronic device to present a software application, such as a global positioning system ("GPS") software application, a map software application, or an airport software application, as non-limiting examples. Additionally, the electronic device can determine, based on application-specific information 1240, that the electronic device is being used during an aviation event, and subsequently adjust some hardware devices. For example, the electronic device may include a light sensor (e.g., light sensor 360 shown in FIG. 5) used to detect light intensity incident on the display, and adjust the display brightness based upon the detected light intensity.

In another example, accessory device 1200 is an automotive-based accessory device and application-specific information 1240, when received by an electronic device, causes the electronic device to initiate a software application(s) related to vehicles or driving. As a result, processing circuitry of the electronic device may signal a display of the electronic device to present a software application, such as a GPS software application or a map software application, as non-limiting examples. Additionally, the electronic device can determine, based on application-specific information 1240, that the electronic device is being used while a user is driving, and subsequently adjust some hardware devices. For example, the electronic device can deactivate touch input capabilities of the display, thereby preventing the user from interacting with the display while driving for purposes of user safety.

In yet another example, accessory device 1200 is a home automation accessory device and application-specific information 1240, when received by an electronic device, causes the electronic device to initiate a software application(s) related to controls of hardware within a household. As a result, processing circuitry of the electronic device may signal a display of the electronic device to present one or more software applications, such as a home lighting control software application, a garage control software application, one or more home appliance control software applications, and/or a home security software application, as non-limiting examples. Accordingly, the user is automatically provided with home-based software applications when the electronic device receives application-specific information 1240.

Figure 16:
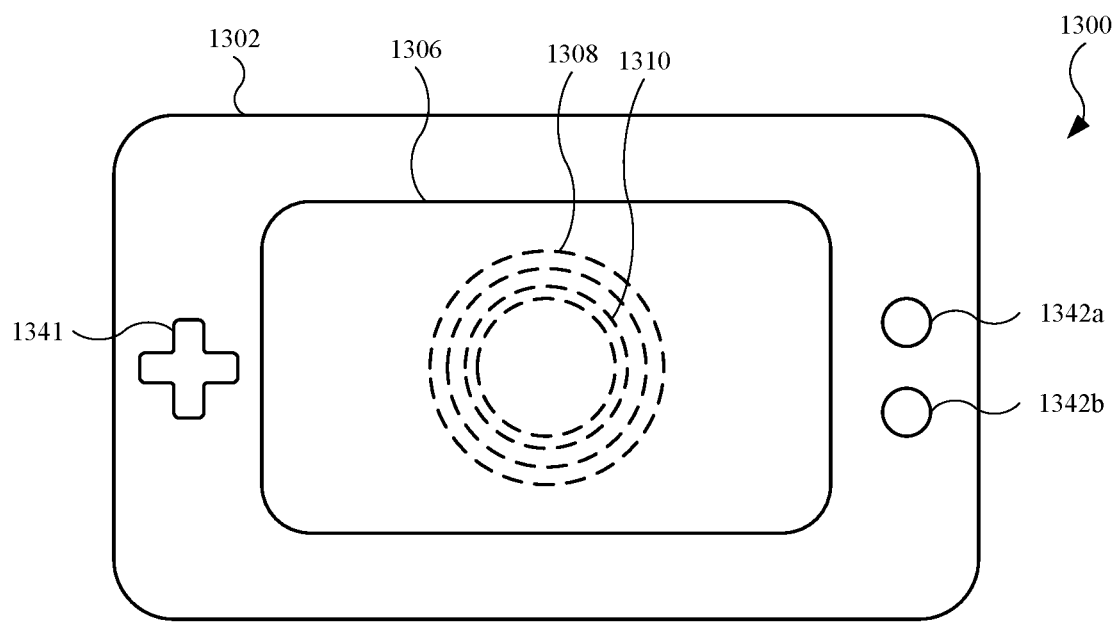
FIG. 16 illustrates a plan view of an alternate embodiment of an accessory device, showing the accessory device designed as a game controller.

FIG. 16 illustrates a plan view of an alternate embodiment of an accessory device 1300, showing accessory device 1300 designed as a game controller. As shown, accessory device 1300 includes a housing 1302 having a receptacle 1306 designed to receive an electronic device (not shown in FIG. 16). Also, accessory device 1300 may include a magnetic assembly 1308 and a wireless communication circuit 1310 that may include any features described herein for a magnetic assembly and a wireless communication circuit, respectively. Although not shown, accessory device 1300 may include a connector or electrical contacts (in a location corresponding to receptacle 1306) designed to electrically couple with the electronic device.

Accessory device 1300, as a game controller, includes a controller 1341 and buttons 1342a and 1342b, all of which are designed to provide a gaming control/input to the electronic device while a user interacts with the electronic device via accessory device 1300. In some embodiments, the electronic device can detect a magnetic field vector from magnetic assembly 1308 to authenticate accessory device 1300, and wireless communication circuit 1310 can subsequently provide information to the electronic device related to accessory device 1300. The information may be related to the material makeup of accessory device 1300, which can be used by the electronic device to, for example, alter a set point temperature. Alternatively, or in combination, the information stored on wireless communication circuit 1310 may include application-specific information, and accordingly, accessory device 1300 may cause the electronic device to present one or more gaming software applications on a display of the electronic device.

Figure 17:
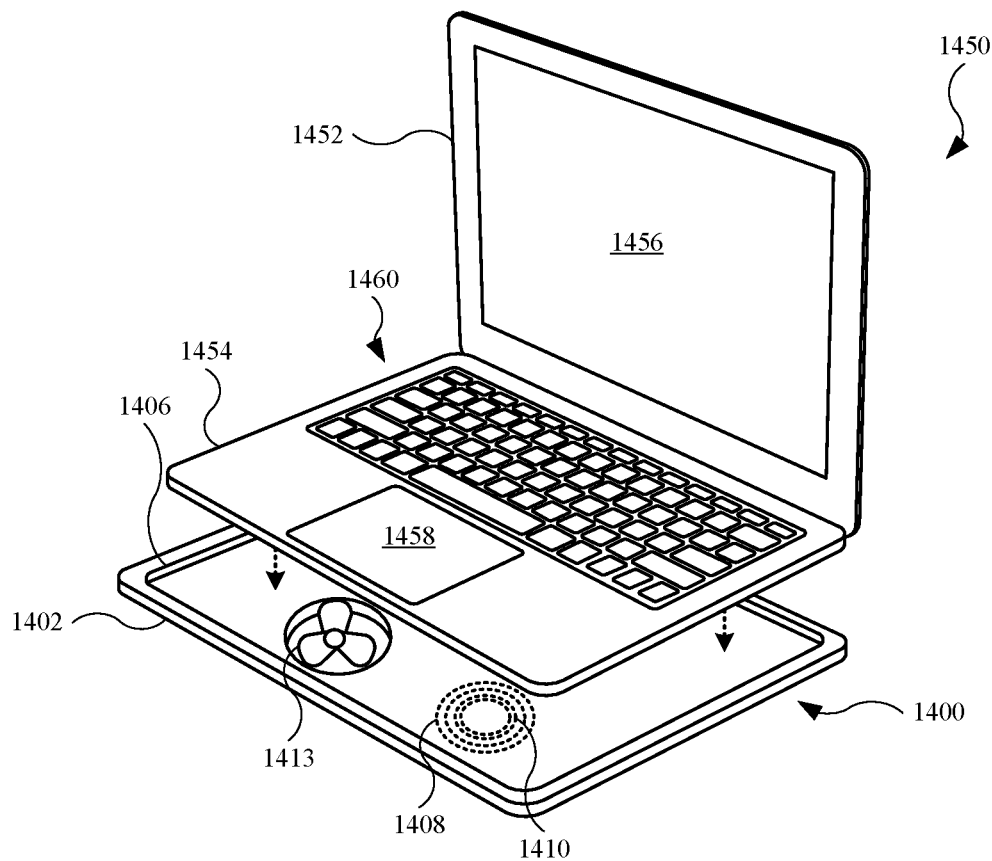
FIG. 17 illustrates an isometric view of an alternate embodiment of an accessory device designed for a laptop computing device.

FIG. 17 illustrates an isometric view of an alternate embodiment of an accessory device 1400 designed for a laptop computing device. As shown, accessory device 1400 includes a housing 1402 having a receptacle 1406 designed to receive an electronic device 1450, representing a laptop computing device including features such as a display housing 1452 that carries a display 1456, and a base portion 1454 (rotationally coupled to display housing 1452) that carries a trackpad 1458 and a keyboard 1460. Also, accessory device 1400 may include a magnetic assembly 1408 and a wireless communication circuit 1410 that may include any features described herein for a magnetic assembly and a wireless communication circuit, respectively.

Similar to prior embodiments, electronic device 1450 can detect a magnetic field vector from magnetic assembly 1408 to authenticate accessory device 1400, and wireless communication circuit 1410 can subsequently provide information to electronic device 1450 related to accessory device 1400. The information may be related to the material makeup of accessory device 1400. Additionally, the information provided to electronic device 1450 may indicate accessory device 1400 includes a cooling mechanism, such as a fan 1413. Based in part upon features such as fan 1413 and/or material makeup of accessory device 1400, electronic device 1450 may alter an operation, such as adjusting (e.g., increasing) a set point temperature, thereby allowing one or more heat-generating operational components of electronic device 1450 to run at higher temperatures, i.e., generate additional thermal energy.

Figure 18:
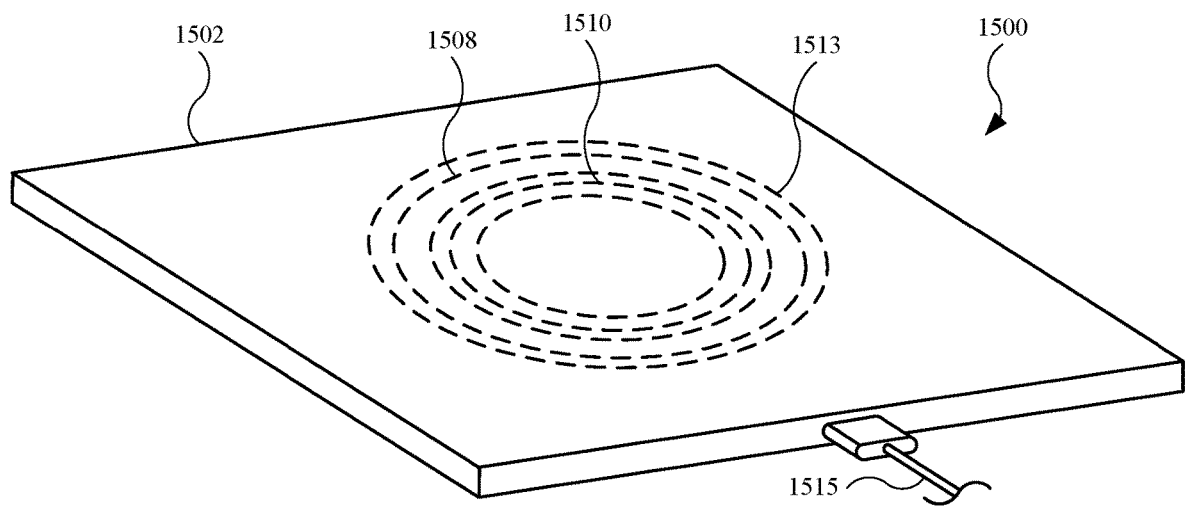
FIG. 18 illustrates an isometric view of an embodiment of an accessory device in the form of a charging mat.
Figure 19:
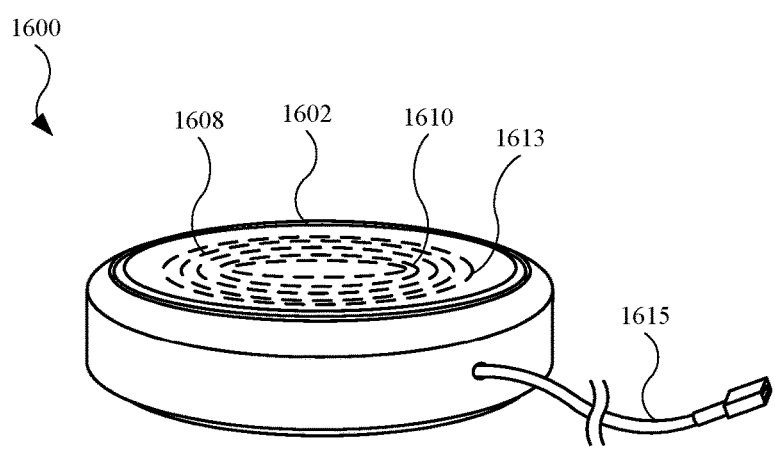
FIG. 19 illustrates an isometric view of an embodiment of an accessory device in the form of a charging module.

FIGS. 18 and 19 show and described alternate forms of accessory devices, in the form of wireless (inductive) charging devices. FIG. 18 illustrates an isometric view of an embodiment of an accessory device 1500 in the form of a charging mat. As shown, accessory device 1500 includes a mat 1502. Mat 1502 can carry a magnetic assembly 1508 and a wireless communication circuit 1510 that may include any features described herein for a magnetic assembly and a wireless communication circuit, respectively. Accessory device 1500 may further include an inductive charging transmitter coil 1513 and a cable 1515 designed to connect to a power source (not shown in FIG. 18), and provide power to inductive charging transmitter coil 1513.

Accessory device 1500, as a charging mat, can receive a device (e.g., smartphone, laptop, headphones, wireless earbuds, smartwatch, digital stylus, etc.) on mat 1502 and subsequently charge the electronic device through wireless charging using inductive charging transmitter coil 1513. When placed on mat 1502, the electronic device can authenticate accessory device 1500 through detection of a magnetic field vector from magnetic assembly 1508, and subsequently read information from wireless communication circuit 1510. The information from wireless communication circuit 1510 can be used to, for example, adjust the impedance of an inductive charging receiver coil, thereby increasing the efficiency of a wireless charging event provided by accessory device 1500.

FIG. 19 illustrates an isometric view of an embodiment of an accessory device 1600 in the form of a charging module. As shown, accessory device 1600 includes a platform 1602. Platform 1602 can carry a magnetic assembly 1608 and a wireless communication circuit 1610 that may include any features described herein for a magnetic assembly and a wireless communication circuit, respectively. Accessory device 1600 may further include an inductive charging transmitter coil 1613 and a cable 1615 designed to connect to a power source (not shown in FIG. 19), and provide power to inductive charging transmitter coil 1613.

Accessory device 1600, as a charging module, can receive a device (e.g., smartphone, headphones, wireless earbuds, smartwatch, digital stylus, etc.) on platform 1602 and subsequently charge the electronic device through wireless charging using inductive charging transmitter coil 1613. When placed on platform 1602, the electronic device can authenticate accessory device 1600 through detection of a magnetic field vector from magnetic assembly 1608, and subsequently read information from wireless communication circuit 1610. The information from wireless communication circuit 1610 can be used to, for example, adjust the impedance of an inductive charging receiver coil, thereby increasing the efficiency of a wireless charging event provided by accessory device 1600.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A portable electronic device, comprising:
   a housing;
   a magnetic field sensor configured to detect a magnetic field from a magnetic assembly external to the housing;
   processing circuitry electrically coupled to the magnetic field sensor and configured to compare the magnetic field detected by the magnetic field sensor with a predetermined magnetic field, the processing circuitry comprising a circuit;

a wireless communication circuit electrically coupled to the processing circuitry, wherein in response to the processing circuitry determining the magnetic field matches the predetermined magnetic field, within a predetermined tolerance, the wireless communication circuit reads information from an external wireless communication circuit; and a control system that regulates the circuit to operate in accordance with a first set point temperature, and in response to the information received by the wireless communication circuit, the control system regulates the circuit to operate in accordance with a second set point temperature that is greater than the first set point temperature.

2. The portable electronic device of claim 1, further comprising an inductive charging receiving coil, wherein the information received corresponds to a magnet of an accessory device configured to magnetically couple with the inductive charging receiving coil.

3. The portable electronic device of claim 1, wherein the circuit is capable of performing a first set of operations when regulated by the first set point temperature, and the circuit is capable of performing a second set of operations when regulated by the first set point temperature, the second set of operations different from the first set of operations.

4. The portable electronic device of claim 1, wherein the information received corresponds to a thickness of an accessory device configured to surround the housing.

5. The portable electronic device of claim 1, wherein the information received corresponds to a material makeup of an accessory device configured to surround the housing.

6. The portable electronic device of claim 1, wherein the magnetic field sensor comprises a magnetometer.

7. The portable electronic device of claim 1, further comprising memory, wherein the predetermined magnetic field is based on a prior instance of a magnetic field detected by the magnetic field sensor and stored on the memory.

8. A method for controlling temperature in an electronic device, the method comprising:

receiving, by a magnetic field sensor, a magnetic field from a magnetic assembly external to the electronic device;

comparing, by processing circuitry electrically coupled to the magnetic field sensor, the magnetic field with a predetermined magnetic field;

in response to the processing circuitry determining the magnetic field matches the predetermined magnetic field within a predetermined tolerance, receiving, by a wireless communication circuit electrically coupled to the processing circuitry, information from an external wireless communication circuit;

controlling, by a control system, a circuit to operate in accordance with a first set point temperature; and in response to the information being received by the wireless communication circuit, increasing the first set point temperature of the circuit to a second set point temperature greater than the first set point temperature such that the control system regulates the circuit to operate in accordance with the second set point temperature.

9. The method of claim 8, wherein comparing the magnetic field with the predetermined magnetic field comprises verifying the magnetic field is within a predetermined tolerance of the predetermined magnetic field prior to receiving the information.

10. The method of claim 8, wherein receiving, by the wireless communication circuit, the information from the external wireless communication circuit comprises authenticating an accessory device that carries the external wireless communication circuit.

11. The method of claim 8, further comprising:

permitting the circuit to perform a first set of operations when regulated by the first set point temperature; and in response to the information being received by the wireless communication circuit, permitting the circuit to perform a second set of operations different from the first set of operations.

12. The method of claim 8, wherein receiving the information defines received information, and the received information comprises a thickness or a material makeup of an accessory device.

13. The method of claim 8, wherein comparing the magnetic field with the predetermined magnetic field comprises comparing the magnetic field with a prior instance of a magnetic field vector detected by the magnetic field sensor.

* * * * *